(12) United States Patent
Harada et al.

(10) Patent No.: US 8,158,330 B2
(45) Date of Patent: Apr. 17, 2012

(54) RESIST PROTECTIVE COATING COMPOSITION AND PATTERNING PROCESS

(75) Inventors: Yuji Harada, Joetsu (JP); Jun Hatakeyama, Joetsu (JP); Koji Hasegawa, Joetsu (JP); Satoshi Shinachi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 222 days.

(21) Appl. No.: 12/463,750

(22) Filed: May 11, 2009

(65) Prior Publication Data

US 2009/0286182 A1 Nov. 19, 2009

(30) Foreign Application Priority Data

May 12, 2008 (JP) ................................ 2008-124503

(51) Int. Cl.
*G03F 7/004* (2006.01)
*G03F 7/30* (2006.01)

(52) U.S. Cl. ............... 430/273.1; 430/270.1; 430/271.1; 430/326; 430/905; 430/907; 430/910

(58) Field of Classification Search ............... 430/270.1, 430/326, 905, 907, 910, 271.1, 273.1
See application file for complete search history.

(56) References Cited

U.S. PATENT DOCUMENTS

| | | | |
|---|---|---|---|
| 5,541,037 A | 7/1996 | Hatakeyama et al. | |
| 5,714,625 A | 2/1998 | Hada et al. | |
| 6,004,724 A | 12/1999 | Yamato et al. | |
| 6,063,953 A | 5/2000 | Hada et al. | |
| 6,261,738 B1 | 7/2001 | Asakura et al. | |
| 6,312,867 B1 | 11/2001 | Kinsho et al. | |
| 6,512,020 B1 | 1/2003 | Asakura et al. | |
| 6,869,744 B2 | 3/2005 | Hatakeyama | |
| 6,916,591 B2 | 7/2005 | Ohsawa et al. | |
| 7,125,943 B2 * | 10/2006 | Sumida et al. ................ | 526/308 |
| 7,244,545 B2 | 7/2007 | Takebe et al. | |
| 7,399,577 B2 | 7/2008 | Yamato et al. | |
| 7,402,626 B2 * | 7/2008 | Maeda et al. ................ | 524/544 |
| 7,455,952 B2 | 11/2008 | Hatakeyama et al. | |
| 7,531,289 B2 * | 5/2009 | Kinsho et al. ............. | 430/270.1 |
| 7,759,440 B2 * | 7/2010 | Miyazawa et al. ........... | 526/245 |
| 7,887,990 B2 * | 2/2011 | Isono et al. ................ | 430/270.1 |
| 2006/0008736 A1 | 1/2006 | Kanda et al. | |
| 2006/0246373 A1 | 11/2006 | Wang | |
| 2007/0122736 A1 | 5/2007 | Hatakeyama et al. | |
| 2007/0166639 A1 | 7/2007 | Araki et al. | |
| 2008/0032202 A1 | 2/2008 | Ishizuka et al. | |
| 2009/0053650 A1 | 2/2009 | Irie | |

FOREIGN PATENT DOCUMENTS

| | | |
|---|---|---|
| JP | 60-38821 A | 2/1985 |
| JP | 62-62520 A | 3/1987 |
| JP | 62-62521 A | 3/1987 |
| JP | 6-273926 A | 9/1994 |
| JP | 7181685 A | 7/1995 |
| JP | 795222 A | 11/1995 |
| JP | 9095479 A | 4/1997 |
| JP | 9208554 A | 8/1997 |
| JP | 9230588 A | 9/1997 |
| JP | 9246173 A | 9/1997 |
| JP | 9301948 A | 11/1997 |
| JP | 2000314956 A | 11/2000 |
| JP | 2000-336121 A | 12/2000 |
| JP | 2001-166476 A | 6/2001 |
| JP | 2002-99090 A | 4/2002 |
| JP | 2005-264131 A | 9/2005 |
| JP | 2006-91798 A | 4/2006 |
| JP | 2006-133716 A | 5/2006 |
| JP | 2006048029 A | 9/2006 |
| JP | 2006309245 A | 11/2006 |
| JP | 2007140446 A | 6/2007 |
| JP | 2007187887 A | 7/2007 |
| WO | WO-2005/042453 A1 | 5/2005 |
| WO | WO-2005/069676 A1 | 7/2005 |

OTHER PUBLICATIONS

Lin, B.J., "Semiconductor Foundry, Lithography, and Partners", Proc. SPIE, vol. 4690, xxix, 2002.
Owa, et al., "Immersion lithography; its potential performance and issues", Proc. SPIE, vol. 5040, p. 724, 2003.
Hirayama, Taku, "Resist and Cover Material Investigation for Immersion Lithography", Jul. 2003, 2$^{nd}$ Immersion Workshop.
Allen, Robert D. et al., "Design of Protective Topcoats for Immersion Lithography", J. of Polymer Science and Technology, vol. 18, No. 5, pp. 615-619, 2005.
Murase, H. et al., "Neuer Begriff and ein Nano-Hybrid System für Hydrophobie", XXIV FATIPEC Congress Book, vol. B, p. 15, 1997.
Murase, Heihachi et.al., "Characterization of molecular interfaces in hydrophobic systems", Progress in Organic Coatings 31, pp. 97-104, 1997.
Shirota, Naoko et al., "Development of non-topcoat resist polymers for 193-nm immersion lithography", Proc. SPIE, vol. 6519, pp. 651905-1-11, 2007.
Sanders, Dan et al., "New materials for surface energy control of 193 nm photoresists", 4th Immersion Symposium RE-04, 2006.
Ito et al., "Aliphatic Platforms for the Design of 157 nm Chemically Amplified Resists," Advances in Resist Technology and Processing, XIX, 2002 SPIE p. 18.
Journal of Photopolymer Science and Technology, vol. 8, No. 1, 1995 ARIMITSU et al. "Sensitive Enhancement of Chemical Amplification-Type Photoimaging Materials by Acetoacetic Acid Derivatives."
Journal of Photopolymer Science and Technology, vol. 8, No. 1, 1995 Kudo et al. Enhancement of the Sensitivity of Chemical-Amplification-Type Photoimaging Materials by B-Tosyloxyketone Acetals.
Journal of Photopolymer Science and Technology, vol. 9, No. 1, 1996. Arimitsu et al., "Effect of Phenoloic Hydroxyl Residues on the Improvement of Acid-Proliferation-Type Photoimaging Materials."
Nakano et al., "Defectivity Data Taken With a Full-Field Immersion Exposure Tool," 2nd Intl Symposium on Immersion Lithography, Sep. 13, 2005.

* cited by examiner

*Primary Examiner* — John Chu

(74) *Attorney, Agent, or Firm* — Birch, Stewart, Kolasch & Birch, LLP

(57) ABSTRACT

A protective coating composition comprising a copolymer of an alkali-soluble (α-trifluoromethyl) acrylate and a norbornene derivative as a base polymer, optionally in admixture with a second polymer containing sulfonic acid and/or sulfonic acid amine salt in repeat units is applied onto a resist film. The protective coating is effective in minimizing development defects and forming a resist pattern of improved profile.

21 Claims, No Drawings

RESIST PROTECTIVE COATING COMPOSITION AND PATTERNING PROCESS

CROSS-REFERENCE TO RELATED APPLICATION

This non-provisional application claims priority under 35 U.S.C. §119(a) on Patent Application No. 2008-124503 filed in Japan May 12, 2008, the entire contents of which are hereby incorporated by reference.

TECHNICAL FIELD

This invention generally relates to a photolithography process for the microfabrication of semiconductor devices, and particularly to an immersion photolithography process involving directing ArF excimer laser radiation having a wavelength of 193 nm from a projection lens toward a resist-coated substrate, with a liquid (e.g., water) intervening between the lens and the substrate. More particularly, it relates to a resist protective coating composition used to form a protective coating on a resist film for protection, and a process for forming a pattern using the same.

BACKGROUND ART

In the recent drive for higher integration and operating speeds in LSI devices, the pattern rule is made drastically finer. The background supporting such a rapid advance is a reduced wavelength of the light source for exposure. The change-over from i-line (365 nm) of a mercury lamp to shorter wavelength KrF laser (248 nm) enabled mass-scale production of dynamic random access memories (DRAM) with an integration degree of 64 MB (processing feature size $\leq 0.25$ μm). To establish the micropatterning technology necessary for the fabrication of DRAM with an integration degree of 256 MB and 1 GB or more, the lithography using ArF excimer laser (193 nm) is under active investigation. The ArF excimer laser lithography, combined with a high NA lens (NA$\geq 0.9$), is considered to comply with 65-nm node devices. For the fabrication of next 45-nm node devices, the $F_2$ laser lithography of 157 nm wavelength became a candidate. However, because of many problems including a cost and a shortage of resist performance, the employment of $F_2$ lithography was postponed. ArF immersion lithography was proposed as a substitute for the $F_2$ lithography. Efforts have been made for the early introduction of ArF immersion lithography (see Proc. SPIE, Vol. 4690, xxix, 2002).

In the ArF immersion lithography, the space between the projection lens and the wafer is filled with water and ArF excimer laser is irradiated through the water. Since water has a refractive index of 1.44 at 193 nm, pattern formation is possible even using a lens with NA of 1.0 or greater. Theoretically, it is possible to increase the NA to 1.44. The resolution is improved by an increment of NA. A combination of a lens having NA of at least 1.2 with ultra-high resolution technology suggests a way to the 45-nm node (see Proc. SPIE, Vol. 5040, p 724, 2003).

Several problems arise when a resist film is exposed in the presence of water. For example, the acid once generated from a photoacid generator and a basic compound added to the resist can be partially leached in water. As a result, pattern profile changes and pattern collapse can occur. It is also pointed out that water droplets remaining on the resist film, though in a minute volume, can penetrate into the resist film to generate defects.

These drawbacks of the ArF immersion lithography may be overcome by providing a protective coating between the resist film and water to prevent resist components from being leached out and water from penetrating into the resist film (see the 2nd Immersion Workshop, Resist and Cover Material Investigation for Immersion Lithography, 2003).

With respect to the protective coating on the photoresist film, a typical antireflective coating on resist (ARCOR) process is disclosed in JP-A 62-62520, JP-A 62-62521, and JP-A 60-38821. The ARCs are made of fluorinated compounds having a low refractive index, such as perfluoroalkyl polyethers and perfluoroalkyl amines. Since these fluorinated compounds are less compatible with organic substances, fluorocarbon solvents are used in coating and stripping of protective coatings, raising environmental and cost issues.

Other resist protective coating materials under investigation include water-soluble or alkali-soluble materials. See, for example, JP-A 6-273926, Japanese Patent No. 2,803,549, and J. Photopolymer Sci. and Technol., Vol. 18, No. 5, p 615, 2005. Since the alkali-soluble resist protective coating material is strippable with an alkaline developer, it eliminates a need for an extra stripping unit and offers a great cost saving. From this standpoint, great efforts have been devoted to develop water-insoluble resist protective coating materials, for example, resins having alkali-soluble groups such as fluorinated alcohol, carboxyl or sulfo groups on side chains. See WO 2005/42453, WO 2005/69676, JP-A 2005-264131, JP-A 2006-133716, and JP-A 2006-91798.

Required of the resist protective coating materials are not only the ability to prevent the generated acid and basic compound in the photoresist film from being leached out in water and to prevent water from penetrating into the resist film, but also such properties as water repellency and water slip. Of these properties, water repellency is improved by introducing fluorine into the resin and water slip is improved by combining water repellent groups of different species to form a micro-domain structure, as reported, for example, in XXIV FATIPEC Congress Book, Vol. B, p 15 (1997) and Progress in Organic Coatings, 31, p 97 (1997).

One exemplary polymer exhibiting high water slip and water repellency is a fluorinated ring-closing polymerization polymer having hexafluoroalcohol pendants. It is reported in Proc. SPIE, Vol. 6519, p 651905 (2007) that this polymer is further improved in water slip by protecting hydroxyl groups on its side chains with acid labile groups.

Although the introduction of fluorine into resins is effective not only for improving water repellency, but also for improving water slip properties as demonstrated by sliding angle, receding contact angle or the like, excessive introduction of fluorine results in resins with a greater surface contact angle following alkaline development. In the current technology, those defects so called "blob defects" that occur on the resist film surface (especially in the unexposed area) after development are regarded problematic. A tendency is known that a resist film having higher water repellency suffers from more blob defects. Accordingly, introducing extra fluorine into resins for the purpose of enhancing water repellency and water slip increases a likelihood of blob defects occurring.

It is believed that blob defects are caused by water droplets remaining on the resist film surface after development. The internal energy of a water droplet on a resist film increases in the spin drying step and reaches the maximum when the water droplet leaves the resist film surface. At the same time as the water droplet leaves the resist film surface, the resist film surface is damaged by that energy, which is observable as blob defects.

The internal energy of a water droplet on a resist film is higher as the surface becomes more water repellent. When a protective coating with higher water repellency is disposed on a resist film, the resist surface has a greater contact angle due to intermixing between the resist film and the protective coating, increasing a likelihood of blob defects occurring. This indicates that for the purpose of suppressing the occurrence of blob defects, the surface contact angle after development must be reduced in order to reduce the internal energy of a water droplet.

Application of a more hydrophilic resist protective coating may be effective for reducing the surface contact angle after development. However, such a protective coating provides a smaller receding contact angle, which interferes with high-speed scanning and allows water droplets to remain after scanning, giving rise to defects known as water marks. A resist protective coating having carboxyl or sulfo groups is proposed in U.S. Pat. No. 7,455,952 (JP-A 2006-91798). Since both carboxyl and sulfo groups are highly hydrophilic, water repellency and water slip worsen.

It is then proposed to form a protective coating from a blend of a first polymer having sulfo groups and a second polymer having highly water repellent hexafluoroalcohol groups such that the second polymer having hexafluoroalcohol groups is segregated at the surface of the protective coating and the first polymer having sulfo groups is segregated at the interface with the underlying resist. See 4th Immersion Symposium RE-04 New Materials for surface energy control of 193 nm photoresists, Dan Sander et al. Although this protective coating is effective in reducing blob defects, the resist pattern suffers from film slimming after development because sulfo groups bind with an amine component in the resist so that the amine component becomes depleted near the resist surface. There exists a desire for a protective coating which prevents film slimming in order to produce a rectangular profile pattern and renders more hydrophilic the resist surface after development in order to inhibit blob defects.

The resist protective coating materials discussed above are needed not only in the ArF immersion lithography, but also in the electron beam (EB) lithography. When EB lithography is performed for mask image writing, it is pointed out that the resist changes its sensitivity due to evaporation of the acid generated during image writing, evaporation of vinyl ether produced by deprotection of acetal protective groups, or the like, as discussed in JP-A 2002-99090. It is then proposed to suppress resist sensitivity variation by applying a protective coating material to form a barrier film on top of a resist film.

| Citation List | |
|---|---|
| Patent Document 1: | JP-A S62-62520 |
| Patent Document 2: | JP-A S62-62521 |
| Patent Document 3: | JP-A S60-38821 |
| Patent Document 4: | JP-A H06-273926 |
| Patent Document 5: | JP 2803549 |
| Patent Document 6: | WO 2005/42453 |
| Patent Document 7: | WO 2005/69676 |
| Patent Document 8: | JP-A 2005-264131 |
| Patent Document 9: | JP-A 2006-133716 |
| Patent Document 10: | U.S. Pat. No. 7,455,952 (JP-A 2006-91798) |
| Patent Document 11: | JP-A 2002-99090 |
| Non-Patent Document 1: | Proc. SPIE, Vol. 4690, xxix, 2002 |
| Non-Patent Document 2: | Proc. SPIE, Vol. 5040, p 724, 2003 |
| Non-Patent Document 3: | 2nd Immersion Workshop, Resist and Cover Material Investigation for Immersion Lithography (2003) |

-continued

| Citation List | |
|---|---|
| Non-Patent Document 4: | J. Photopolymer Sci. and Technol., Vol. 18, No. 5, p 615, 2005 |
| Non-Patent Document 5: | XXIV FATIPEC Congress Book, Vol. B, p 15 (1997) |
| Non-Patent Document 6: | Progress in Organic Coatings, 31, p 97 (1997) |
| Non-Patent Document 7: | Proc. SPIE, Vol. 6519, p 651905 (2007) |
| Non-Patent Document 8: | 4th Immersion Symposium RE-04 New Materials for surface energy control of 193 nm photoresists, Dan Sander et al. |

SUMMARY OF INVENTION

An object of the invention is to provide a resist protective coating composition which is removable with an alkaline developer, has improved water repellency and water slip, causes few development defects, and allows for formation of a resist pattern of satisfactory profile after development; and a pattern forming process using the protective coating composition.

A protective coating composition comprising a copolymer of an alkali-soluble (α-trifluoromethyl)acrylate and a norbornene derivative, designated polymer P1, P1', P1'' or P2 (collectively referred to as polymer PA) as a base polymer, optionally in blend with a second polymer containing sulfonic acid and/or sulfonic acid amine salt in repeat units, designated polymer P3 or P3' (collectively referred to as polymer PB) is applicable onto a resist film. The resulting protective coating is effective in minimizing development defects and forming a pattern of improved profile.

Accordingly, the present invention provides a resist protective coating composition and a pattern forming process, as defined below.

[1] A resist protective coating composition comprising a polymer P1 comprising repeat units of the general formulae (1a) and (2a):

P1

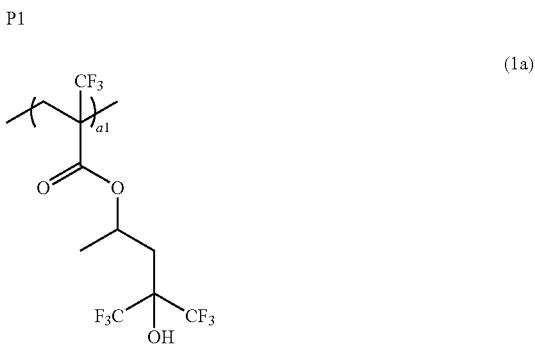

(1a)

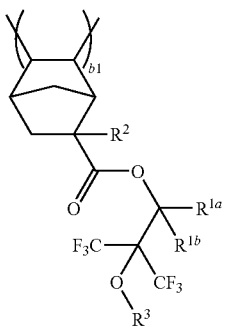

wherein $R^{1a}$ and $R^{1b}$ are hydrogen or straight, branched or cyclic $C_1$-$C_{10}$ alkyl, $R^{1a}$ and $R^{1b}$ may bond together to form a non-aromatic ring with the carbon atom to which they are attached, $R^2$ is hydrogen, methyl or trifluoromethyl, $R^3$ is hydrogen or an acid labile group, and a1 and b1 are numbers satisfying $0<a1<1$, $0<b1<1$, and $0<a1+b1\leq 1$.

[2] A resist protective coating composition comprising a polymer P1' comprising repeat units of the general formulae (1a), (1b) and (2a):

P1'

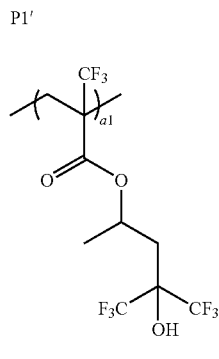

(1a)

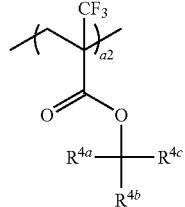

(1b)

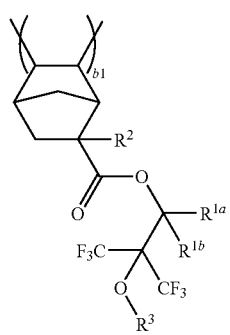

(2a)

wherein $R^{1a}$, $R^{1b}$ and $R^2$ are as defined above, $R^3$ is hydrogen or an acid labile group, $R^{4a}$ to $R^{4c}$ are hydrogen or straight, branched or cyclic $C_1$-$C_{10}$ alkyl, and a1, a2 and b1 are numbers satisfying $0<a1<1$, $0<a2<1$, $0<b1<1$, and $0<a1+a2+b1\leq 1$.

[3] A resist protective coating composition comprising a polymer P1″ comprising repeat units of the general formulae (1a), (1b), (2a) and (2b):

P1″

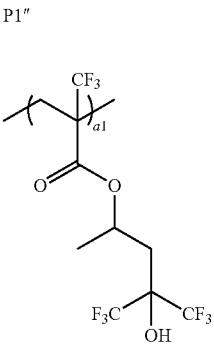

(1a)

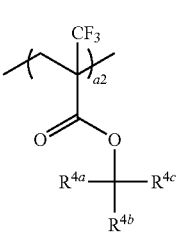

(1b)

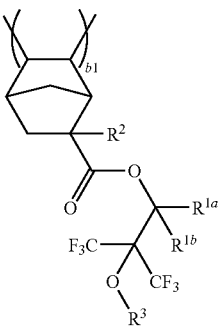

(2a)

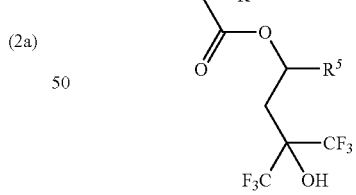

(2b)

wherein $R^{1a}$, $R^{1b}$, $R^2$, $R^3$, $R^{4a}$ to $R^{4c}$ are as defined above, $R^5$ is straight, branched or cyclic $C_1$-$C_{10}$ alkyl, and a1, a2, b1 and b2 are numbers satisfying $0<a1<1$, $0\leq a2<1$, $0\leq b1<1$, $0<b2<1$, and $0<a1+a2+b1+b2\leq 1$.

[4] A resist protective coating composition comprising a polymer P2 corresponding to a polymer P1-H comprising repeat units of the general formulae (1a) and (2a') wherein some or all of hydroxyl groups in either one or both of formula (1a) and formula (2a') are protected with protective groups,

P1-H

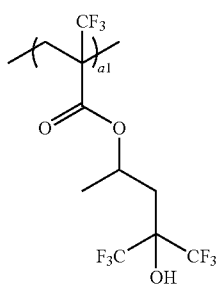
(1a)

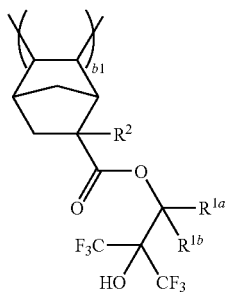
(2a')

wherein $R^{1a}$, $R^{1b}$, $R^2$, a1 and b1 are as defined above.

[5] The resist protective coating composition of any one of [1] to [4], further comprising a polymer P3 comprising repeat units of the general formulae (3a), (3b), (4a) and (4b):

P3

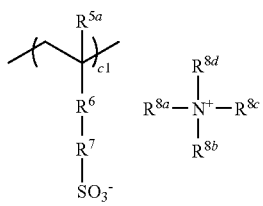
(3a)

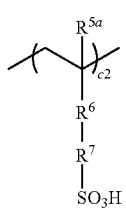
(3b)

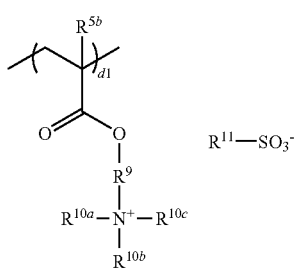
(4a)

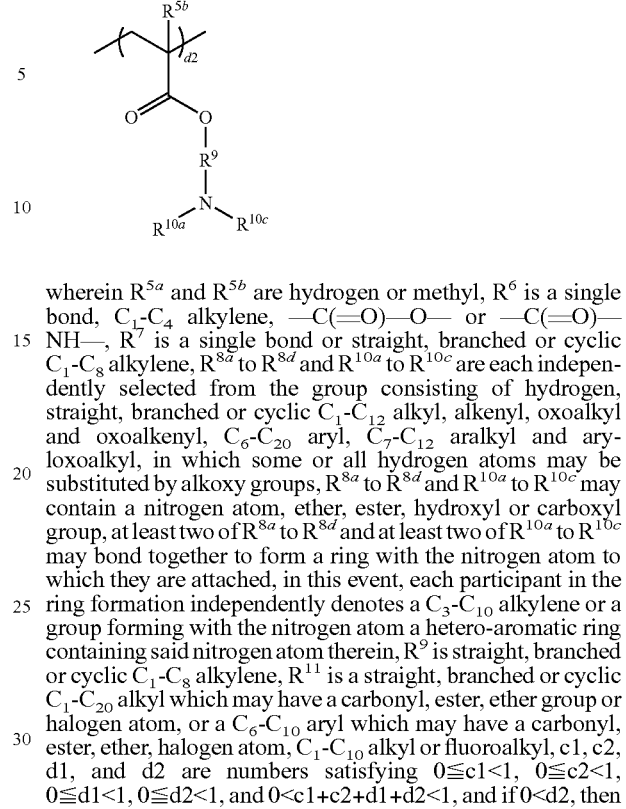

wherein $R^{5a}$ and $R^{5b}$ are hydrogen or methyl, $R^6$ is a single bond, $C_1$-$C_4$ alkylene, —C(=O)—O— or —C(=O)—NH—, $R^7$ is a single bond or straight, branched or cyclic $C_1$-$C_8$ alkylene, $R^{8a}$ to $R^{8d}$ and $R^{10a}$ to $R^{10c}$ are each independently selected from the group consisting of hydrogen, straight, branched or cyclic $C_1$-$C_{12}$ alkyl, alkenyl, oxoalkyl and oxoalkenyl, $C_6$-$C_{20}$ aryl, $C_7$-$C_{12}$ aralkyl and aryloxoalkyl, in which some or all hydrogen atoms may be substituted by alkoxy groups, $R^{8a}$ to $R^{8d}$ and $R^{10a}$ to $R^{10c}$ may contain a nitrogen atom, ether, ester, hydroxyl or carboxyl group, at least two of $R^{8a}$ to $R^{8d}$ and at least two of $R^{10a}$ to $R^{10c}$ may bond together to form a ring with the nitrogen atom to which they are attached, in this event, each participant in the ring formation independently denotes a $C_3$-$C_{10}$ alkylene or a group forming with the nitrogen atom a hetero-aromatic ring containing said nitrogen atom therein, $R^9$ is straight, branched or cyclic $C_1$-$C_8$ alkylene, $R^{11}$ is a straight, branched or cyclic $C_1$-$C_{20}$ alkyl which may have a carbonyl, ester, ether group or halogen atom, or a $C_6$-$C_{10}$ aryl which may have a carbonyl, ester, ether, halogen atom, $C_1$-$C_{10}$ alkyl or fluoroalkyl, c1, c2, d1, and d2 are numbers satisfying $0 \leq c1 < 1$, $0 \leq c2 < 1$, $0 \leq d1 < 1$, $0 \leq d2 < 1$, and $0 < c1+c2+d1+d2 < 1$, and if $0 < d2$, then $0 < c2$.

[6] The resist protective coating composition of any one of [1] to [5], further comprising a polymer P3' comprising repeat units of the general formulae (3a), (3b), (4a), (4b) and (5):

P3'

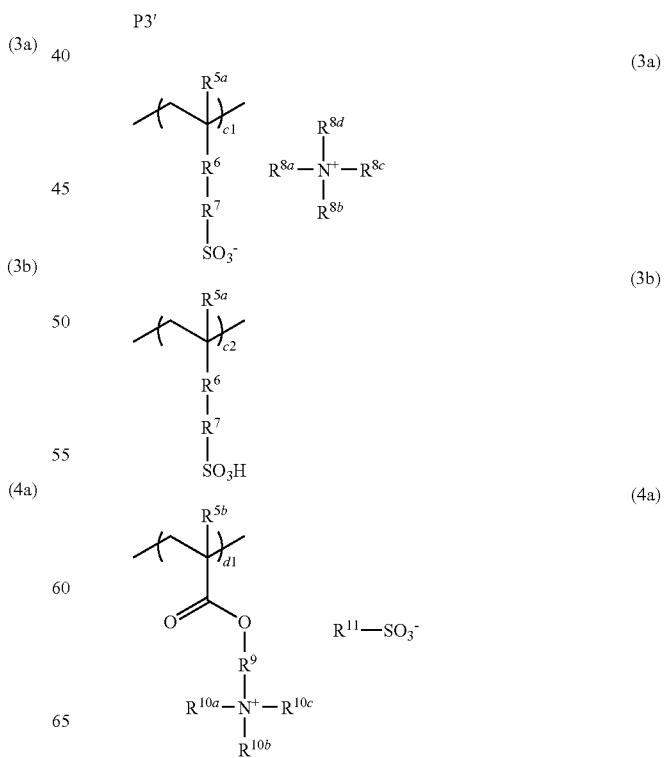

-continued

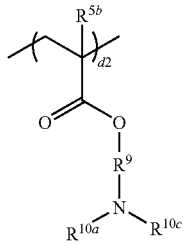

(4b)

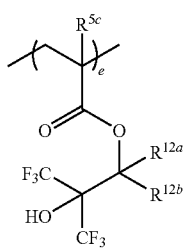

(5)

wherein $R^{5a}$ to $R^{5c}$, $R^6$, $R^7$, $R^{8a}$ to $R^{8d}$, $R^9$, $R^{10a}$ to $R^{10c}$, and $R^{11}$ are as defined above, $R^{12a}$ and $R^{12b}$ are hydrogen or straight, branched or cyclic $C_1$-$C_{10}$ alkyl, $R^{12a}$ and $R^{12b}$ may bond together to form a ring with the carbon atom to which they are attached, c1, c2, d1, d2, and e are numbers satisfying $0 \leq c1<1$, $0 \leq c2<1$, $0 \leq d1<1$, $0 \leq d2<1$, $0<e<1$, $0<c1+c2+d1+d2<1$, and $0.3 \leq c1+c2+d1+d2+e \leq 1$, and if $0<d2$, then $0<c2$.

[7] The protective coating composition of any one of [1] to [6], further comprising a solvent.

[8] The protective coating composition of [7] wherein the solvent comprises an ether compound of 8 to 12 carbon atoms.

[9] The protective coating composition of [7] or [8] wherein the solvent comprises at least one ether compound of 8 to 12 carbon atoms selected from the group consisting of di-n-butyl ether, diisobutyl ether, di-sec-butyl ether, di-n-pentyl ether, diisopentyl ether, di-sec-pentyl ether, di-t-amyl ether, di-n-hexyl ether, methyl cyclopentyl ether, and methyl cyclohexyl ether.

[10] The protective coating composition of [8] or [9] wherein the solvent comprises a mixture of the ether compound and 0.1 to 90% by weight of a higher alcohol of 4 to 10 carbon atoms.

[11] The protective coating composition of [10] wherein the higher alcohol is at least one compound selected from the group consisting of 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol.

[12] A pattern forming process comprising the steps of (1) applying a resist material onto a substrate to form a photoresist film, (2) applying the resist protective coating composition of any one of [1] to [11] onto the photoresist film to form a protective coating thereon, (3) heat treating and exposing the coated substrate to high-energy radiation from a projection lens through a photomask while holding a liquid between the substrate and the projection lens, and (4) developing with a developer.

[13] The process of [12] wherein the liquid is water.

[14] The process of [12] or [13] wherein the high-energy radiation has a wavelength in the range of 180 to 250 nm.

[15] The process of any one of [12] to [14] wherein the developing step uses a liquid alkaline developer for thereby developing the photoresist film to form a resist pattern and stripping the resist protective coating therefrom at the same time.

[16] A lithography process for forming a pattern, comprising the steps of forming a protective coating on a photoresist layer disposed on a mask blank, exposing the layer structure in vacuum to electron beam, and developing, wherein the protective coating is formed of the protective coating composition of any one of [1] to [11].

ADVANTAGEOUS EFFECTS OF INVENTION

The resist protective coating composition of the invention has a large receding contact angle enough to inhibit leaching-out of resist components and penetration of water into a resist film during immersion exposure. It also ensures that the resist film is developed into a satisfactorily profiled pattern with minimal development defects.

DESCRIPTION OF EMBODIMENTS

The singular forms "a", "an" and "the" include plural references unless the context clearly dictates otherwise.

The notation (Cn-Cm) means a group containing from n to m carbon atoms per group.

Polymer

The polymers P1, P1' and P1" used in the resist protective coating composition of the invention are characterized by comprising repeat units having the general formulae (1a), (1b), (2a), and (2b).

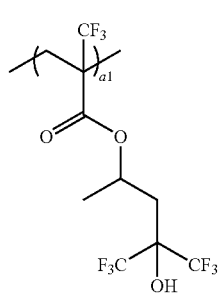

(1a)

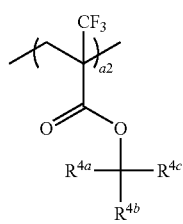

(1b)

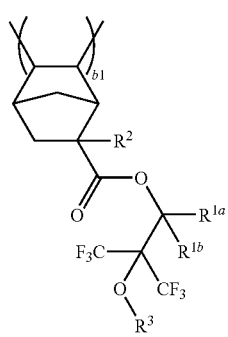

(2a)

-continued (2b)

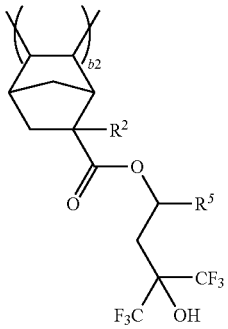

Herein $R^{1a}$ and $R^{1b}$ are hydrogen or straight, branched or cyclic $C_1$-$C_{10}$ alkyl, or $R^{1a}$ and $R^{1b}$ may bond together to form a non-aromatic ring with the carbon atom to which they are attached. $R^2$ is hydrogen, methyl or trifluoromethyl. $R^3$ is hydrogen or an acid labile group. $R^{4a}$ to $R^{4c}$ are hydrogen or straight, branched or cyclic $C_1$-$C_{10}$ alkyl. $R^5$ is straight, branched or cyclic $C_1$-$C_{10}$ alkyl. The subscripts a1, a2, b1 and b2 are numbers satisfying 0<a1<1, 0≦a2<1, 0≦b1<1, 0≦b2<1, 0<a1+a2<1, 0<b1+b2<1, and 0<a1+a2+b1+b2≦1.

The meaning of a1+a2+b1+b2=1 is that in a polymer comprising repeat units (1a), (1b), (2a) and (2b), the total of repeat units (1a), (1b), (2a) and (2b) is 100 mol % based on the total amount of entire repeat units. The sum of contents of repeat units (1a) and (1b) is preferably 20 to 80 mol %, and more preferably 30 to 70 mol %. The meaning of a1+a2+b1+b2<1 is that the total of repeat units (1a), (1b), (2a) and (2b) is less than 100 mol % based on the total amount of entire repeat units, indicating the inclusion of other repeat units.

In formulae (1b), (2a) and (2b), exemplary straight, branched or cyclic $C_1$-$C_{10}$ alkyl groups represented by $R^{1a}$, $R^{1b}$, $R^{4a}$ to $R^{4c}$, and $R^5$ include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. $R^{1a}$ and $R^{1b}$ may bond together to form a non-aromatic ring with the carbon atom to which they are attached, wherein each of $R^{1a}$ and $R^{1b}$ is alkylene, examples of which include the foregoing alkyl groups with one hydrogen atom eliminated, and exemplary rings include cyclopentyl and cyclohexyl.

The acid labile group represented by $R^3$ in formula (2a) may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

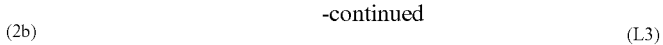

(L1)

(L2)

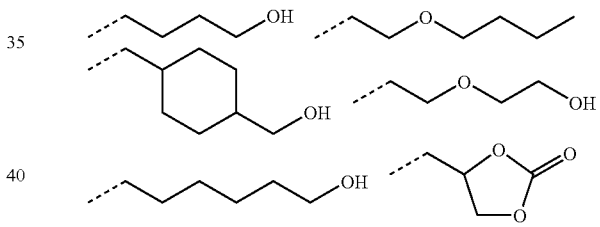

(L3)

(L4)

Herein, the broken line denotes a valence bond. In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

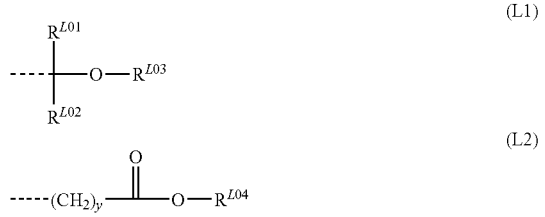

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of ring-forming $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_{10}$ alkyl group or an optionally substituted $C_6$-$C_{20}$ aryl group. Examples of the optionally substituted alkyl groups include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which some methylene groups are replaced by oxygen or sulfur atoms. Examples of optionally substituted aryl groups include phenyl, methylphenyl, naphthyl, anthryl, phenanthryl, and pyrenyl. Letter m is equal to 0 or 1, n is equal to 0, 1, 2 or 3, and 2m+n is equal to 2 or 3.

In formula (L4), $R^{L06}$ is an optionally substituted, straight, branched or cyclic $C_1$-$C_{10}$ alkyl group or an optionally substituted $C_6$-$C_{20}$ aryl group. Examples of these groups are the same as exemplified for $R^{L05}$. $R^{L07}$ to $R^{L16}$ independently represent hydrogen or monovalent hydrocarbon groups of 1 to 15 carbon atoms. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

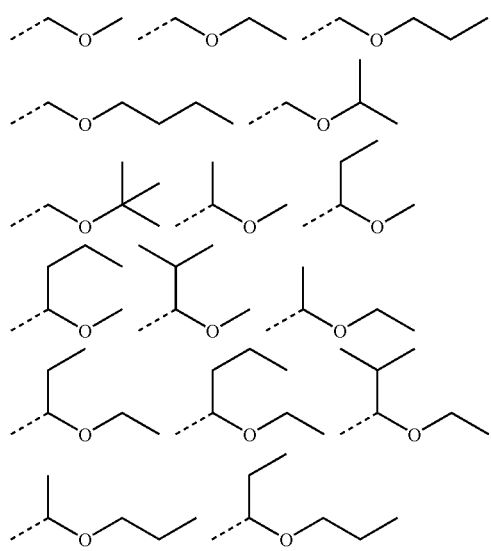

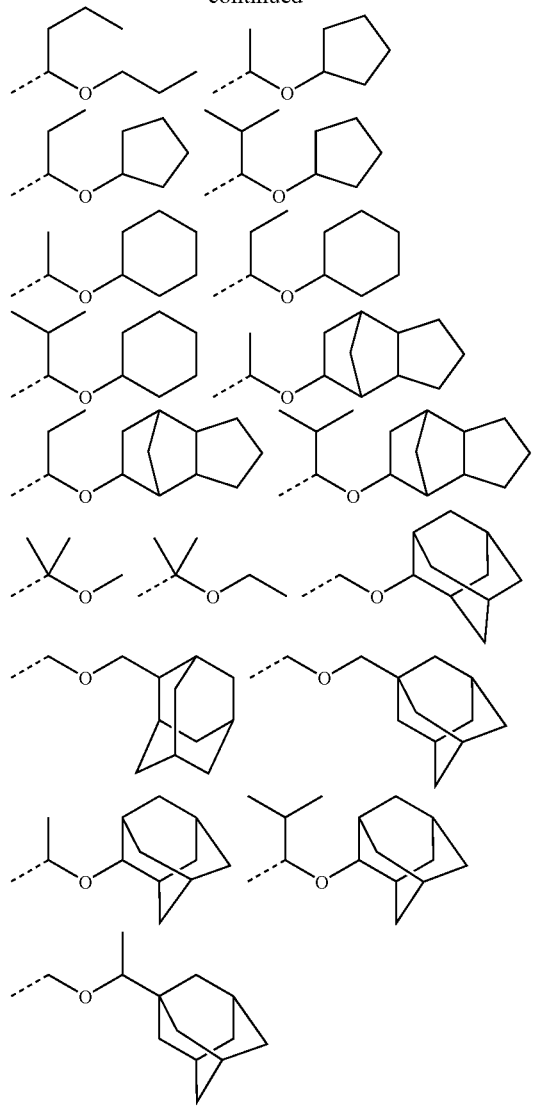

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl) cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are preferred.

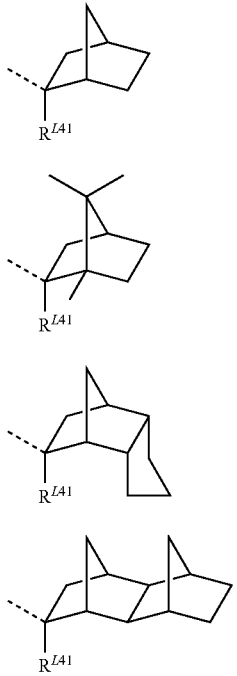

(L4-1)

(L4-2)

(L4-3)

(L4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

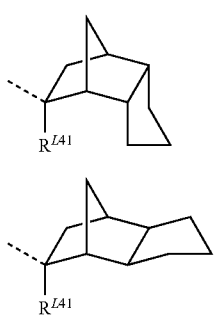

(L4-3-1)

(L4-3-2)

Note that $R^{L41}$ is as defined above.

Similarly, the general formula (L4-4) represents one or a mixture of two or more selected from groups having the following general formulas (L4-4-1) to (L4-4-4).

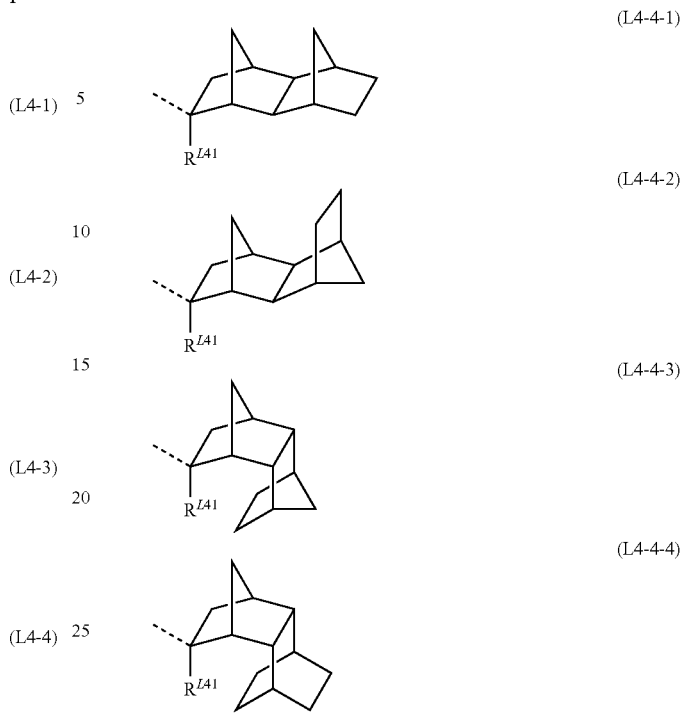

(L4-4-1)

(L4-4-2)

(L4-4-3)

(L4-4-4)

Note that $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo [2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

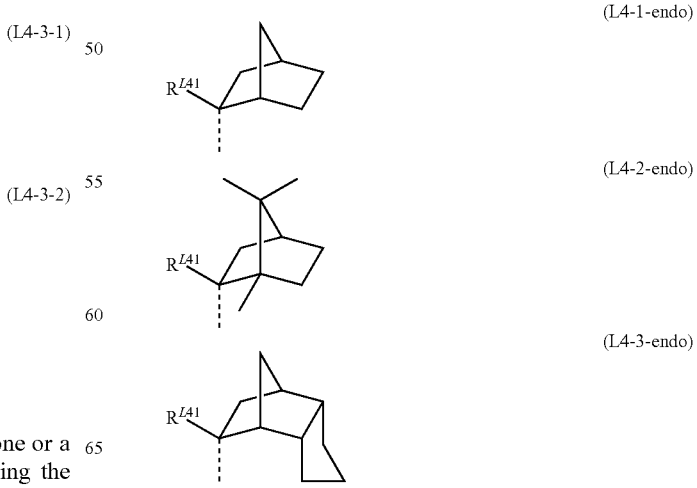

(L4-1-endo)

(L4-2-endo)

(L4-3-endo)

-continued (L4-4-endo)

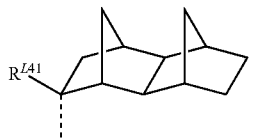

Note that $R^{L41}$ is as defined above.

Illustrative examples of the acid labile group of formula (L4) are given below

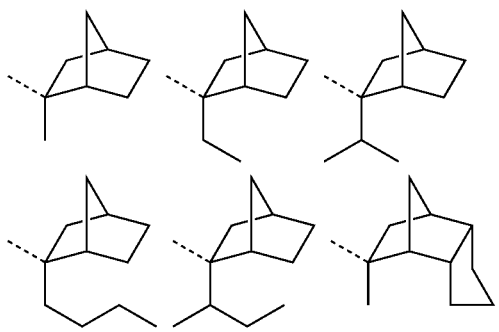

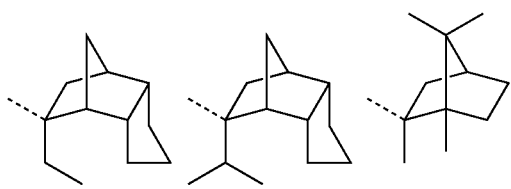

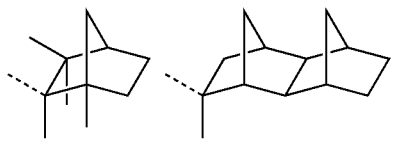

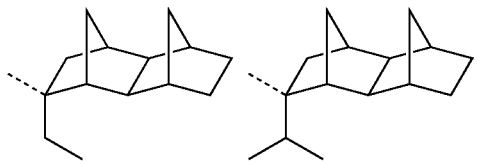

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by $R^3$, are as exemplified for $R^{L04}$ and the like.

In the resist protective coating composition of the fourth aspect, the base polymer may be a polymer P2 corresponding to a polymer P1-H comprising repeat units of the general formulae (1a) and (2a') as essential units wherein some or all of hydroxyl groups in either one or both of formula (1a) and formula (2a') are protected with protective groups. It is acceptable that some or all hydroxyl groups in formulae (1a) and (2a') be protected with protective groups.

P1-H

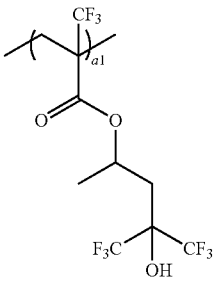

(1a)

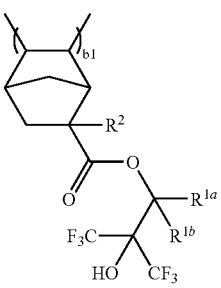

(2a')

Herein $R^{1a}$ and $R^{1b}$ are hydrogen or straight, branched or cyclic $C_1$-$C_{10}$ alkyl, $R^{1a}$ and $R^{1b}$ may bond together to form a non-aromatic ring with the carbon atom to which they are attached. $R^2$ is hydrogen, methyl or trifluoromethyl. The subscripts a1 and b1 are numbers satisfying 0<a1<1, 0<b1<1, and 0<a1+b1≦1.

As in the foregoing embodiment, the meaning of a1+b1=1 is that the total of repeat units (1a) and (2a') is 100 mol % based on the total amount of entire repeat units. A proportion of repeat units (1a) is preferably 20 to 80 mol %, and more preferably 30 to 70 mol %. The meaning of a1+b1<1 is that the total of repeat units (1a) and (2a') is less than 100 mol % based on the total amount of entire repeat units, indicating the inclusion of other repeat units.

In formula (2a'), exemplary straight, branched or cyclic $C_1$-$C_{10}$ alkyl groups represented by $R^{1a}$ and $R^{1b}$ include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. $R^{1a}$ and $R^{1b}$ may bond together to form a ring as described above, wherein each of $R^{1a}$ and $R^{1b}$ is alkylene, examples of which include the foregoing alkyl groups with one hydrogen atom eliminated, and suitable rings are as exemplified above.

While the method of protecting hydroxyl groups on the polymer P1-H comprising repeat units of formulae (1a) and (2a') will be described later, the protective groups used herein include acid labile groups as illustrated for $R^3$ and straight, branched or cyclic $C_1$-$C_{10}$ alkyl groups. Exemplary straight, branched or cyclic $C_1$-$C_{10}$ alkyl groups include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl.

In the polymer P2, a degree of protection of hydroxyl groups on polymer P1-H may vary from 0 mol % to 100 mol % of the entire hydroxyl groups. As a degree of protection is increased, water slip performance such as sliding angle and receding contact angle can be enhanced. However, an excessive increase in degree of protection results in a resin having a reduced alkali dissolution rate. In practice, a polymer having a degree of protection of hydroxyl groups in the range of 0 to 60 mol %, and preferably 10 to 40 mol % is used for a balance of water slip performance and alkali dissolution rate.

Illustrative, non-limiting examples of the repeat units of formula (1b) are given below.

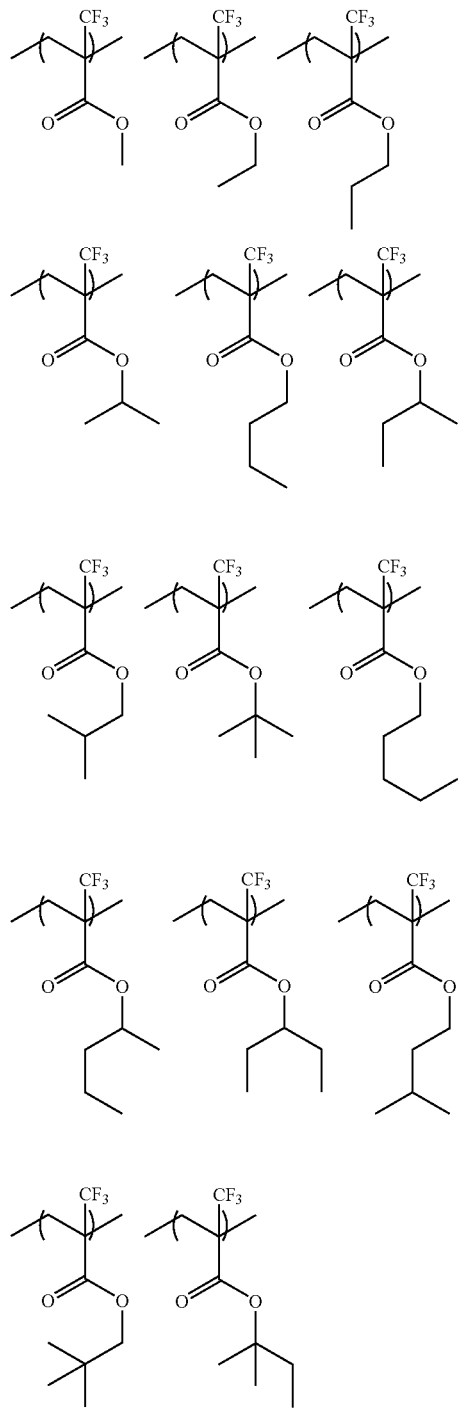

Illustrative, non-limiting examples of the repeat units of formula (2a) are given below.

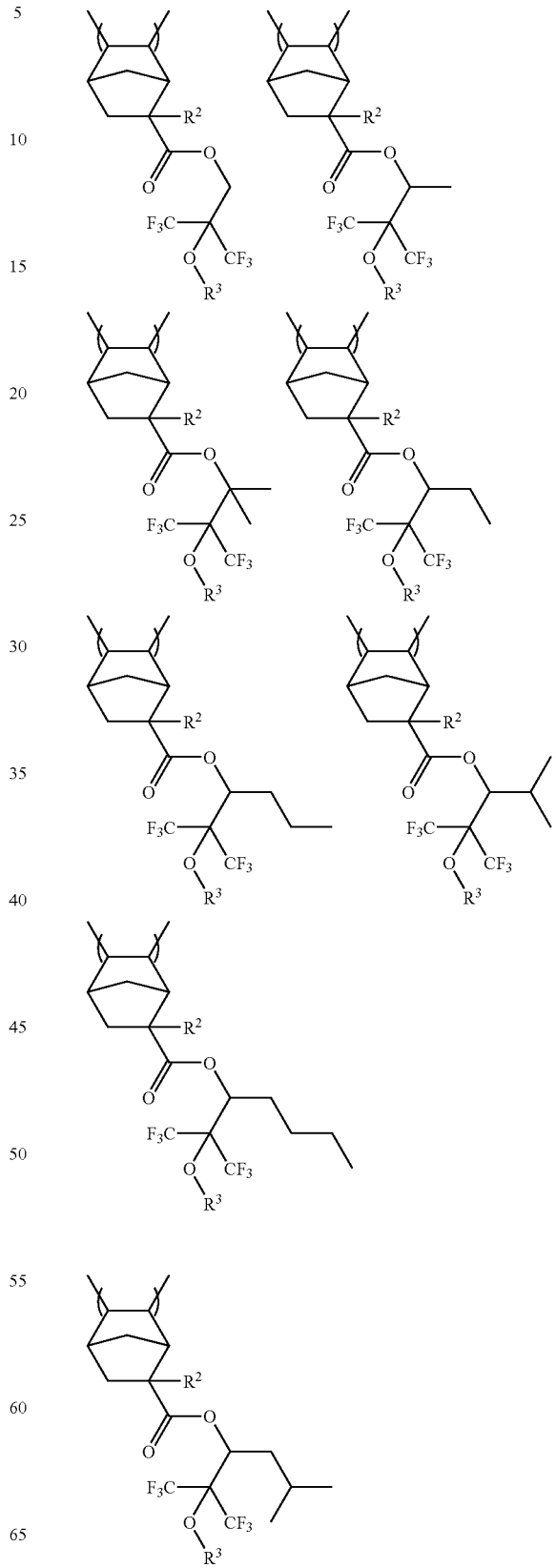

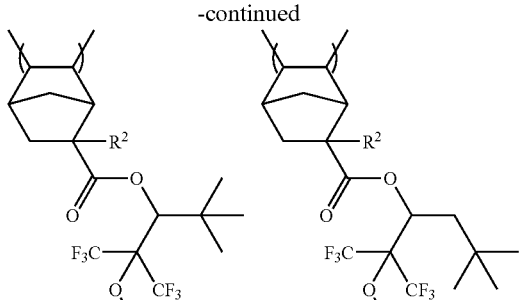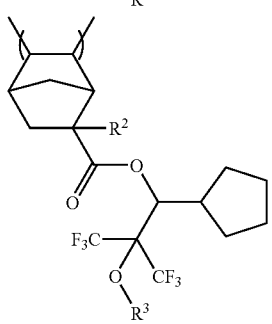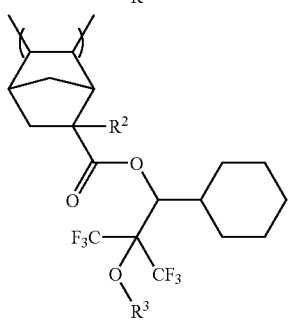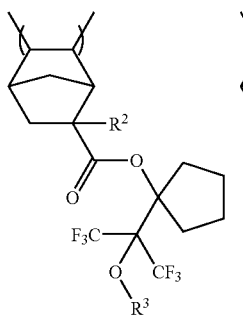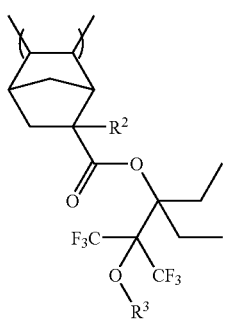
Herein $R^2$ and $R^3$ are as defined above.
Illustrative, non-limiting examples of the repeat units of formula (2b) are given below.
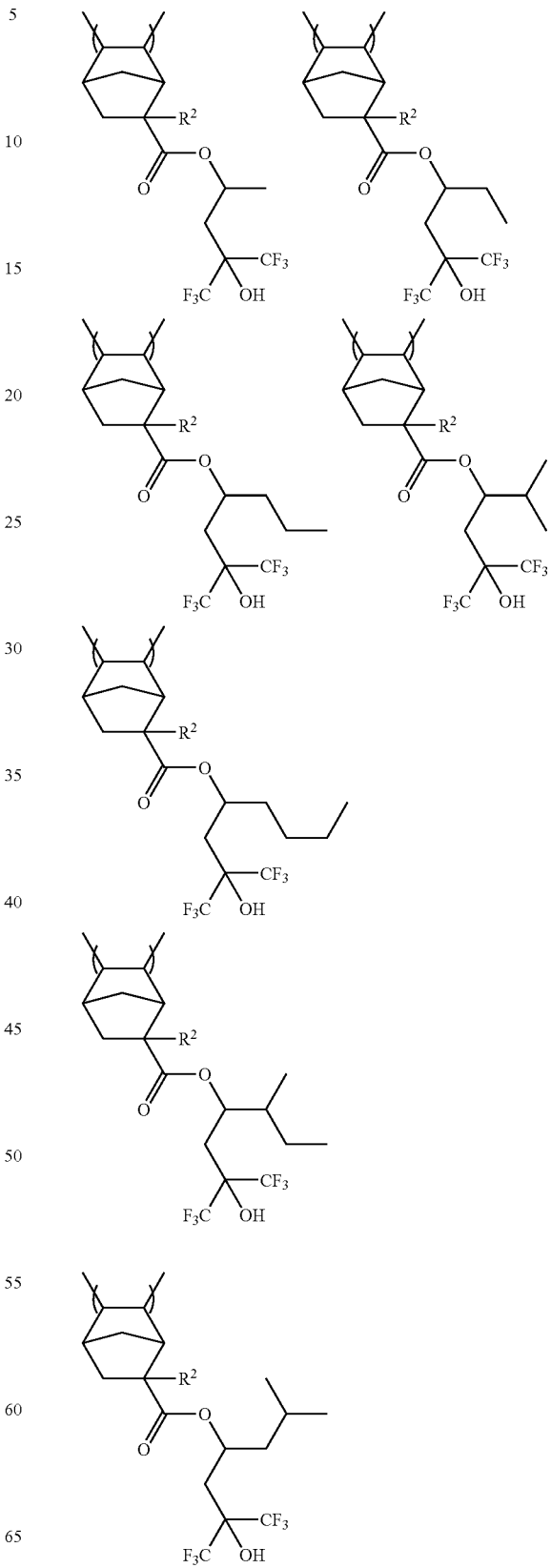

-continued

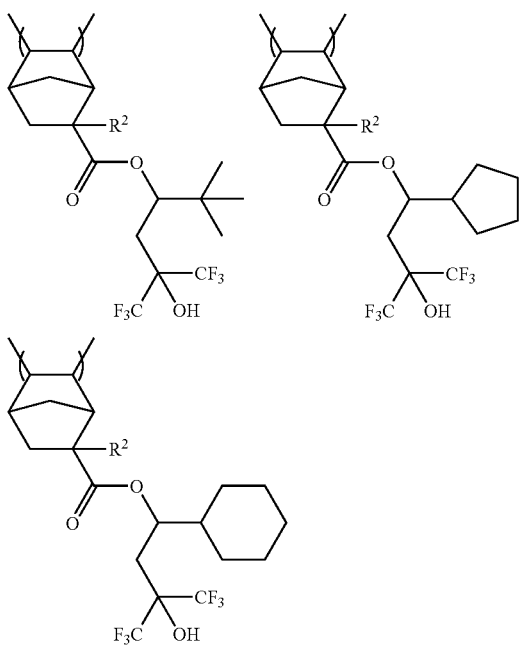

Herein R² is as defined above.

In addition to the polymer PA, the resist protective coating composition may further comprise in admixture a polymer P3 or P3' comprising repeat units of the general formulae (3a), (3b), (4a), (4b), and (5) (collectively referred to as polymer PB).

P3

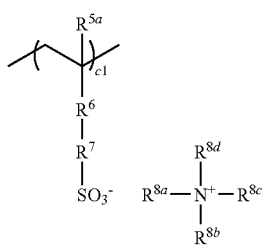
(3a)

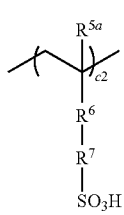
(3b)

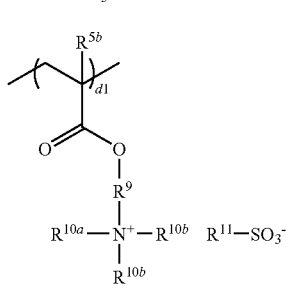
(4a)

P3'

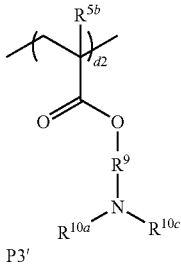
(4b)

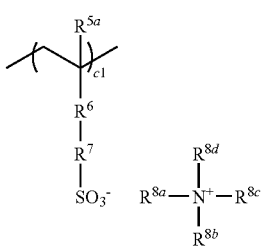
(3a)

(3b)

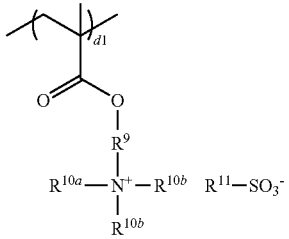
(4a)

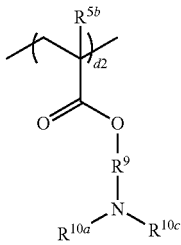
(4b)

(5)

Herein $R^{5a}$ and $R^{5b}$ are hydrogen or methyl. $R^6$ is a single bond, or a $C_1$-$C_4$ alkylene group, —C(=O)—O— or —C(=O)—NH—. $R^7$ is a single bond or a straight, branched or cyclic $C_1$-$C_8$ alkylene group. $R^{8a}$ to $R^{8d}$ and $R^{10a}$ to $R^{10c}$ are each independently selected from hydrogen, straight, branched or cyclic $C_1$-$C_{12}$ alkyl, alkenyl, oxoalkyl and oxoalkenyl, $C_6$-$C_{20}$ aryl, $C_7$-$C_{12}$ aralkyl and aryloxoalkyl groups, in which some or all hydrogen atoms may be substituted by alkoxy groups, and $R^{8a}$ to $R^{8d}$ and $R^{10a}$ to $R^{10c}$ may contain a nitrogen atom, ether, ester, hydroxyl or carboxyl group therein. At least two of $R^{8a}$ to $R^{8d}$ and at least two of $R^{10a}$ to $R^{10c}$ may bond together to form a ring with the nitrogen atom to which they are attached, in this event, each participant in the ring formation independently denotes a $C_3$-$C_{10}$ alkylene or a group forming with the nitrogen atom a hetero-aromatic ring containing the nitrogen atom therein. $R^9$ is a straight, branched or cyclic $C_1$-$C_8$ alkylene group. $R^{11}$ is a straight, branched or cyclic $C_1$-$C_{20}$ alkyl group which may have a carbonyl, ester, ether group or halogen atom, or a $C_6$-$C_{10}$ aryl group which may have a carbonyl, ester, ether, halogen atom, $C_1$-$C_{10}$ alkyl or fluoroalkyl. $R^{12a}$ and $R^{12b}$ are hydrogen or a straight, branched or cyclic $C_1$-$C_{10}$ alkyl group, or $R^{12a}$ and $R^{12b}$ may bond together to form a non-aromatic ring with the carbon atom to which they are attached. The subscripts c1, c2, d1, d2, and e are numbers satisfying $0 \leq c1 < 1$, $0 \leq c2 < 1$, $0 \leq d1 < 1$, $0 \leq d2 < 1$, $0 < e < 1$, $0 < c1+c2+d1+d2 < 1$, and $0.3 \leq c1+c2+d1+d2+e \leq 1$, and if $0 < d2$, then $0 < c2$.

As in the foregoing embodiments, the meaning of c1+c2+d1+d2+e=1 is that the total of repeat units (3a), (3b), (4a), (4b), and (5) is 100 mol % based on the total amount of entire repeat units. A proportion of repeat units (3a), (3b), (4a) and (4b) is preferably 1 to 50 mol %, and more preferably 1 to 40 mol % whereas a proportion of repeat units (5) is preferably 50 to 99 mol %, and more preferably 60 to 99 mol %. The meaning of c1+c2+d1+d2+e<1 is that the total of repeat units (3a), (3b), (4a), (4b), and (5) is less than 100 mol % based on the total amount of entire repeat units, indicating the inclusion of other repeat units.

In formulae (3a) and (3b), $R^6$ denotes $C_1$-$C_4$ alkylene, examples of which include methyl, ethyl, n-propyl, isopropyl, n-butyl, sec-butyl and tert-butyl, with one hydrogen atom eliminated.

In formulae (3a), (3b), (4a) and (4b), $R^7$ and $R^9$ denote straight, branched or cyclic $C_1$-$C_8$ alkylene, examples of which include methyl, ethyl, n-propyl, isopropyl, n-butyl, sec-butyl, tert-butyl, tert-amyl, n-pentyl, n-hexyl, n-heptyl, n-octyl, cyclopentyl, cyclohexyl, cyclopentylmethyl, cyclopentylethyl, cyclohexylmethyl, and cyclohexylethyl, with one hydrogen atom eliminated. Examples of $R^{8a}$ to $R^{8d}$, $R^{10a}$ to $R^{10c}$ and $R^{11}$ will become apparent from the examples illustrated below.

Illustrative, non-limiting examples of the repeat units of formula (3a) are given below.

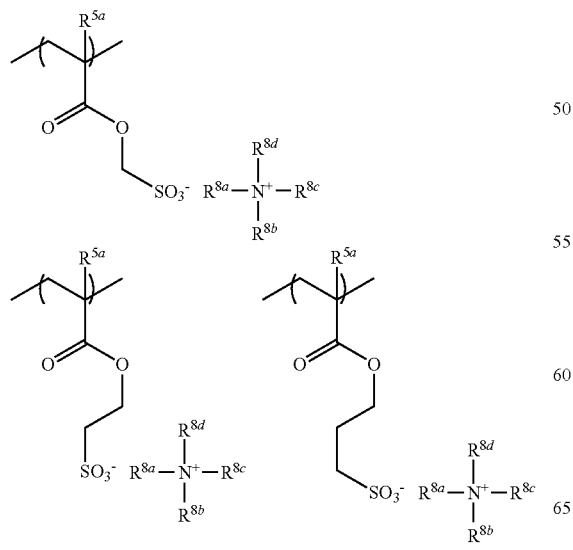
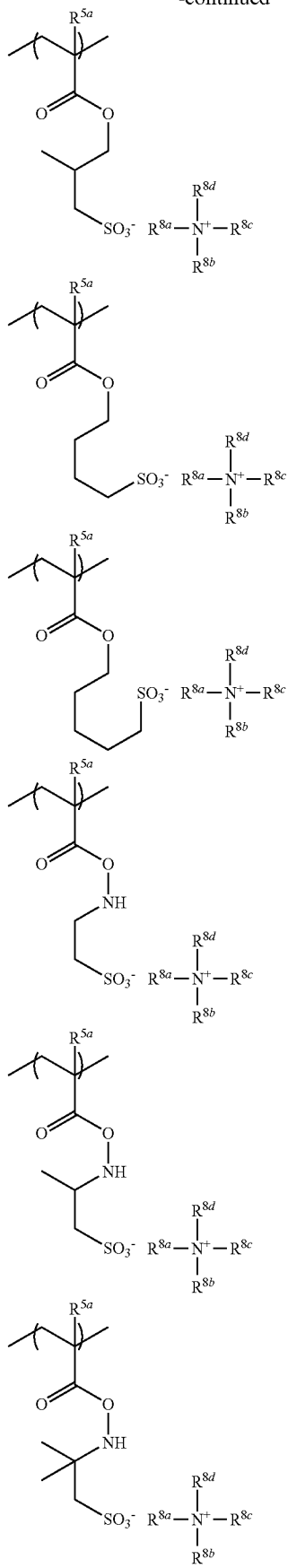

-continued

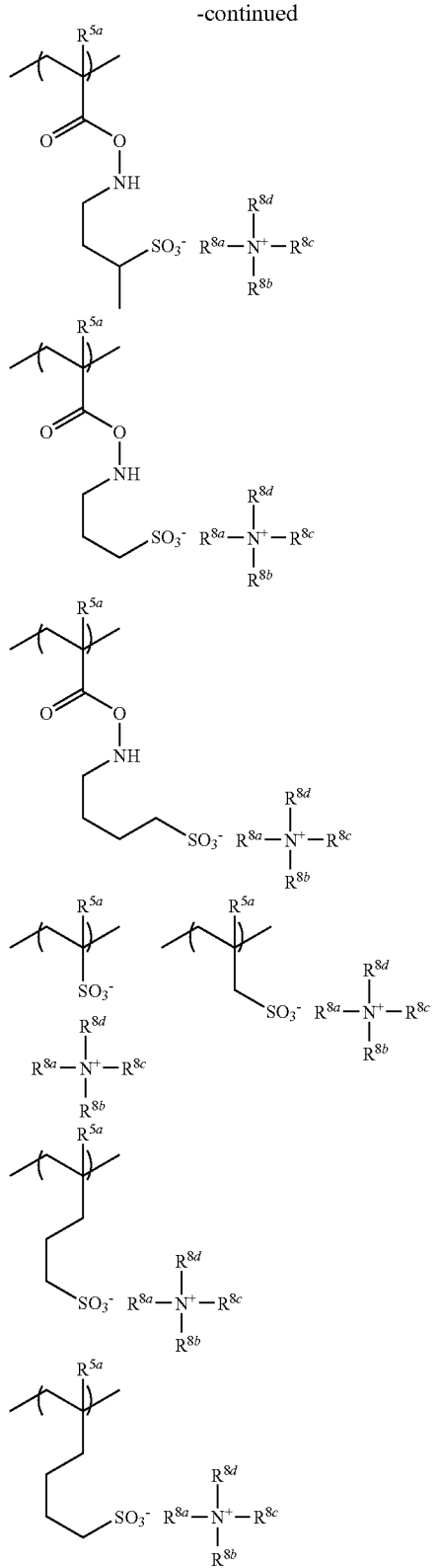

Herein $R^{5a}$, $R^{8a}$ to $R^{8d}$ are as defined above.

In the repeat units of formula (3a), the ammonium salt (cation moiety) formed by $R^{8a}$ to $R^{8d}$ may be obtained from neutralization reaction of an amine compound. The amine compound used herein is typically selected from primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, amide derivatives, imide derivatives, and carbamate derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives, such as, for example, nicotinic acid, alanine, alginine, aspartic acid, asparagine, glutamic acid, glutamine, glycine, histidine, isoleucine, glycylleucine, leucine, methionine, phenylalanine, threonine, lysine, 3-aminopyrazine-2-carboxylic acid, methoxyalanine, sacrosine, serine, phenylalanine, threonine, lysine, proline, tryptophan, 5-hydroxylysine, cysteine, tyrosine, N,N-dimethylalanine, N,N-dimethylalginine, N,N-dimethylaspartic acid, N,N-dimethylasparagine, N,N-dimethylglutamic acid, N,N-dimethylglutamine, N,N-dimethylglycine, N,N-dimethylhistidine, N,N-dimethylisoleucine, N,N-dimethylglycylleucine, N,N-dimethylleucine, N,N-dimethylmethionine, N,N-dimethylphenylalanine, N,N-dimethylthreonine, N,N-dimethyllysine, N,N-dimethylsacrosine, N,N-dimethylserine, N,N-dimethylphenylalanine, N,N-dimethylthreonine, N,N-dimethyllysine, N,N-dimethyl-5-hydroxylysine, N,N-dimethylalginine, N,N-dimethylcysteine, and N,N-dimethyltyrosine. Examples of suitable nitrogen-containing compounds having sulfonyl group include 3-pyridinesulfonic acid and pyridinium p-toluenesulfonate. Examples of suitable nitrogen-containing compounds having hydroxyl or hydroxyphenyl group include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

Also useful are ammonium salts in the neutralized forms of one or more basic compounds having the general formula (B)-1.

$$N(X')_n(Y')_{3-n} \quad \text{(B)-1}$$

In the formula, n is equal to 1, 2 or 3; Y' is independently hydrogen or a straight, branched or cyclic $C_1$-$C_{20}$ alkyl group which may contain an ether or hydroxyl group; and X' is independently selected from groups of the following general formulas (X)-1 to (X)-3, and two or three X's may bond together to form a ring.

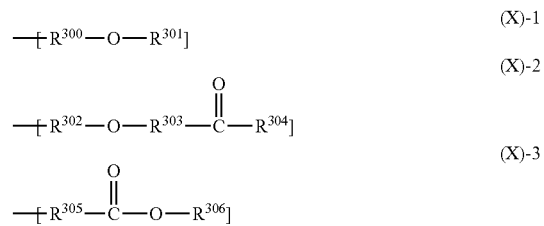

Herein $R^{300}$, $R^{302}$ and $R^{305}$ are independently straight or branched $C_1$-$C_4$ alkylene, $R^{305}$ may be a single bond; $R^{301}$ and $R^{304}$ are independently hydrogen or a straight, branched or cyclic $C_1$-$C_{20}$ alkyl group which may contain one or more hydroxyl, ether, ester groups or lactone rings; $R^{303}$ is a single bond or a straight or branched $C_1$-$C_4$ alkylene group; and $R^{306}$ is hydrogen or a straight, branched or cyclic $C_1$-$C_{20}$ alkyl group which may contain one or more hydroxyl, ether, ester groups or lactone rings.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-

(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, β-(diethylamino)-δ-valerolactone, glycine methyl ester, glycine ethyl ester, glycine propyl ester, N,N-dimethylglycine methyl ester, N,N-dimethylglycine ethyl ester, N,N-dimethylglycine propyl ester, alanine methyl ester, alanine ethyl ester, alanine propyl ester, N,N-dimethylalanine methyl ester, N,N-dimethylalanine ethyl ester, N,N-dimethylalanine propyl ester, valine methyl ester, valine ethyl ester, valine propyl ester, N,N-dimethylvaline methyl ester, N,N-dimethylvaline ethyl ester, N,N-dimethylvaline propyl ester, leucine methyl ester, leucine ethyl ester, leucine propyl ester, N,N-dimethylleucine methyl ester, N,N-dimethylleucine ethyl ester, N,N-dimethylleucine propyl ester, isoleucine methyl ester, isoleucine ethyl ester, isoleucine propyl ester, N,N-dimethylisoleucine methyl ester, N,N-dimethylisoleucine ethyl ester, N,N-dimethylisoleucine propyl ester, dimethyl aspartate, and dimethyl glutamate.

Note that those compounds of formula (B)-1 wherein $R^{305}$ in formula (X)-3 is a single bond are carbamate amines, examples of which are described in JP-A 2001-166476.

Also useful are ammonium salts in the neutralized forms of one or more basic compounds of cyclic structure having the general formula (B)-2.

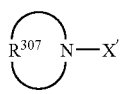

(B)-2

Herein X' is as defined above, and $R^{307}$ is a straight or branched $C_2$-$C_{20}$ alkylene group which may contain one or more carbonyl, ether, ester or sulfide groups.

Illustrative examples of the basic compounds of cyclic structure having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Further useful are ammonium salts in the neutralized forms of one or more cyano-containing basic compounds having the general formulae (B)-3 to (B)-6.

(B)-3

(B)-4

(B)-5

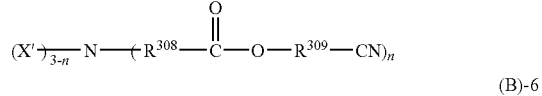

(B)-6

Herein, X', $R^{307}$ and n are as defined above, and $R^{308}$ and $R^{309}$ are each independently a straight or branched $C_1$-$C_4$ alkylene group.

Illustrative examples of the cyano-containing basic compounds include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2- acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl) aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

In the repeat units of formula (3a), the ammonium salt formed by $R^{8a}$ to $R^{8d}$ and nitrogen may be obtained from neutralization reaction of a (meth)acrylate having a sulfo pendant group with a corresponding amine or ion exchange reaction with an ammonium salt having the general formula (6).

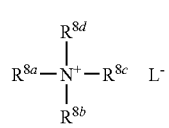

(6)

Herein $R^{8a}$ to $R^{8d}$ are as defined above, $L^-$ is $OH^-$, $Cl^-$, $Br^-$, $I^-$, $RCO_2^-$, or $NO_3^-$, and R is hydrogen or a monovalent organic group.

The repeat units of formula (3a) may be obtained by various methods including polymer synthesis followed by ion exchange reaction as mentioned above, or neutralization of a polymer containing sulfo groups by addition of an amine. In the latter case, if the amount of amine added is small, an amine salt is not uniformly formed within polymer units which may cause local bridge defects upon pattern formation. To avoid such inconvenience, it is possible that neutralization or ion exchange reaction be carried out in a monomer form, and this be followed by polymerization using the resulting monomer having a sulfonic acid amine salt uniformly distributed.

Illustrative, non-limiting examples of the repeat units of formula (3b) are given below.

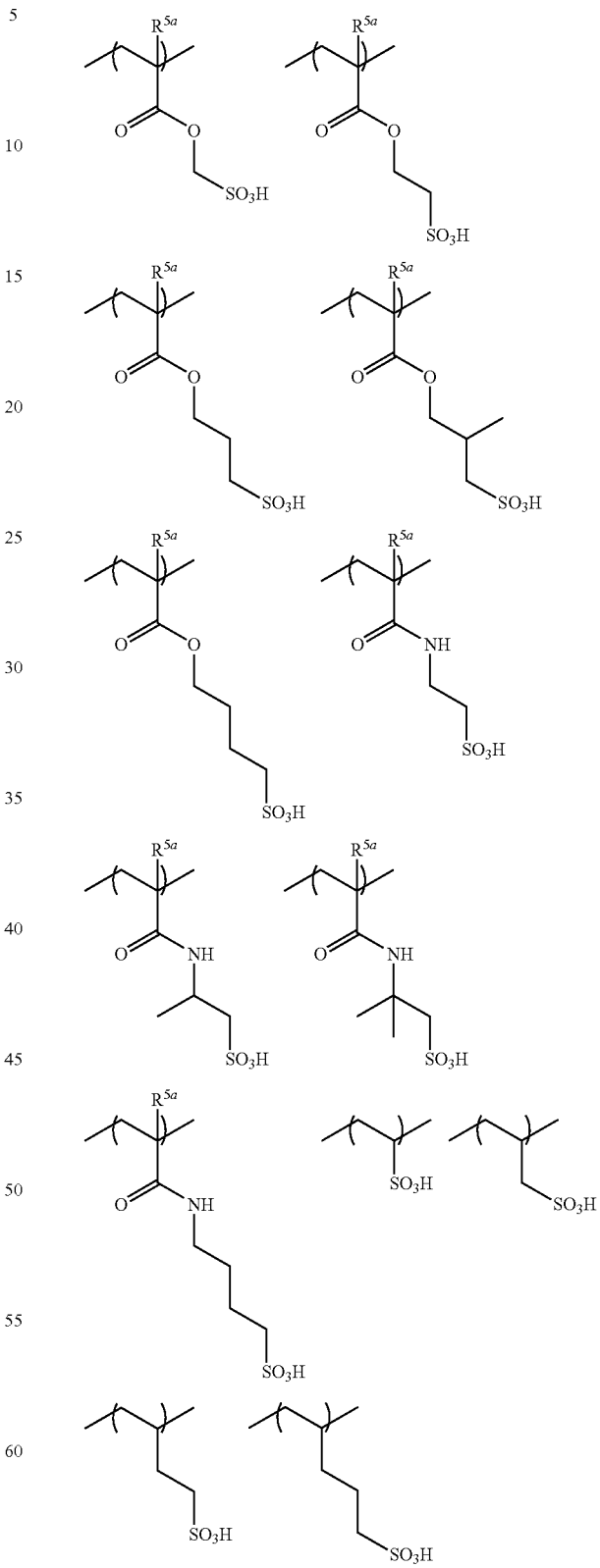

Herein $R^{5a}$ is as defined above.

Referring to the repeat units of formula (4a), examples of the cation moiety are illustrated below.
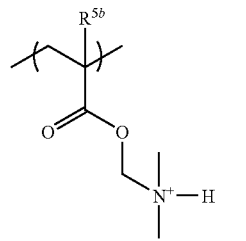 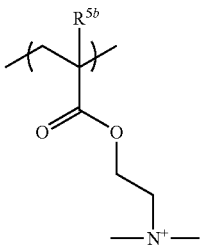
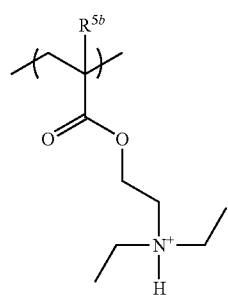 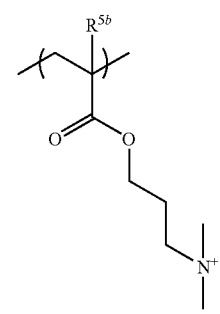
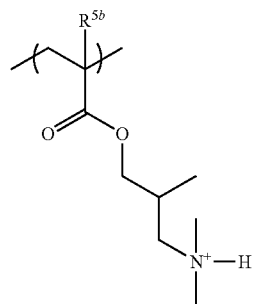 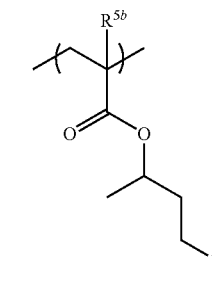
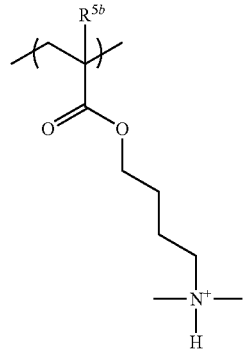 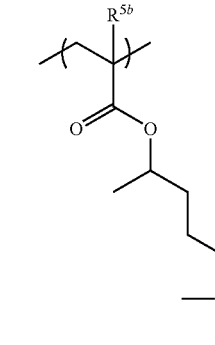
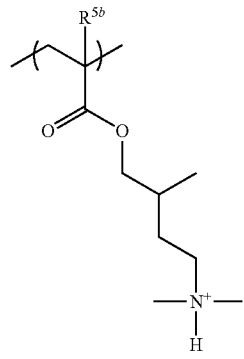 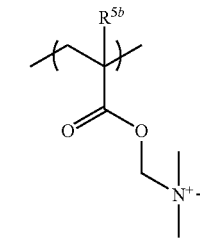
-continued
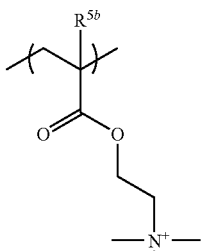 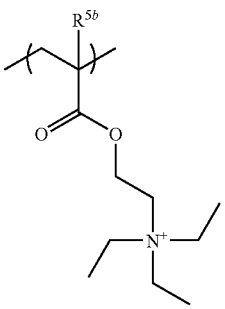
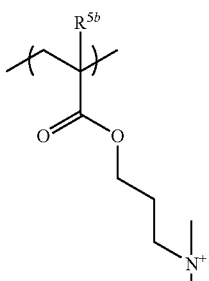 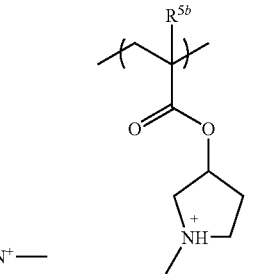
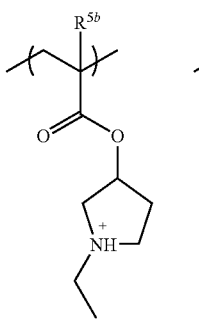 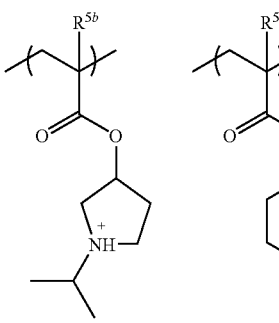
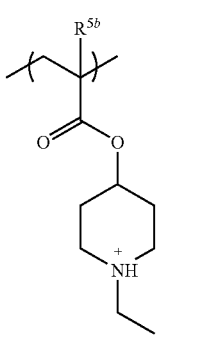 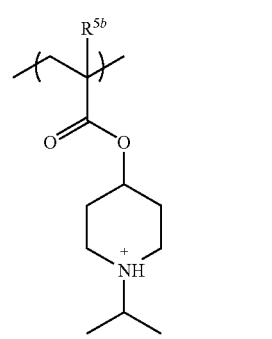
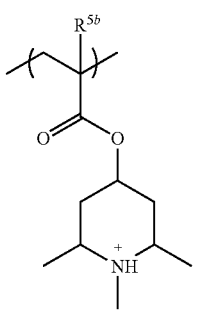 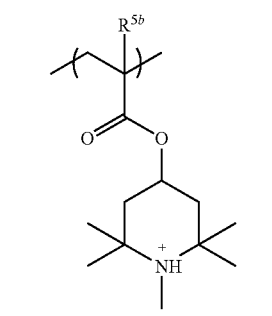

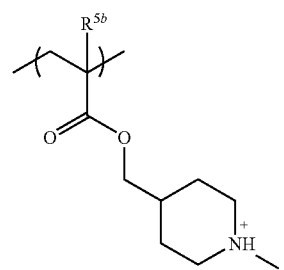
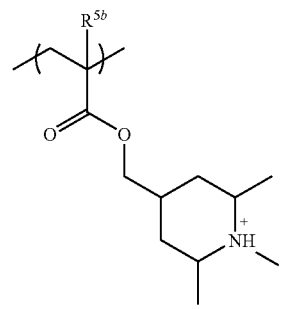
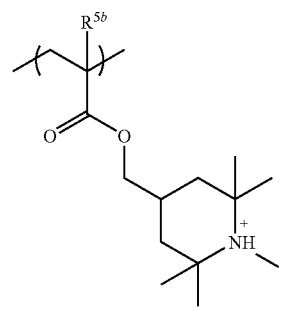
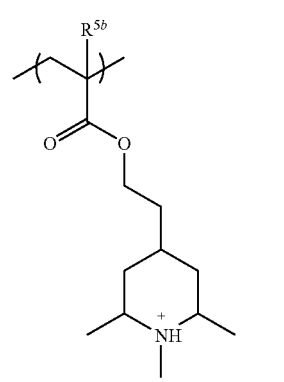
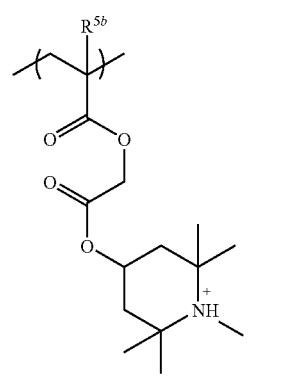
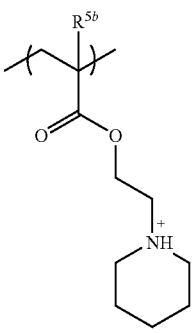
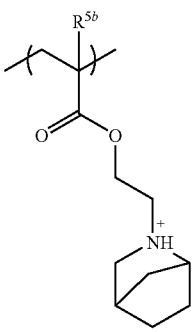
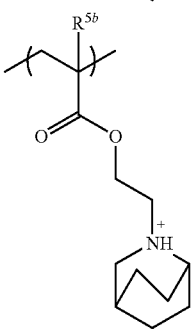
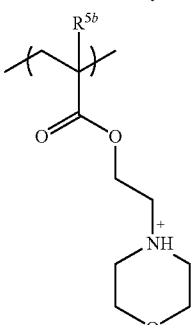
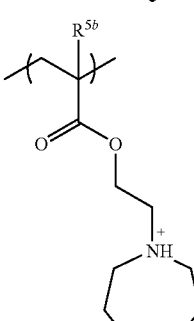
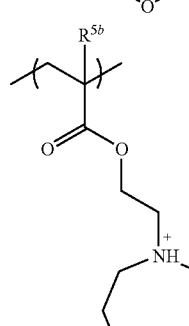
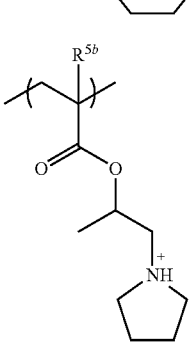
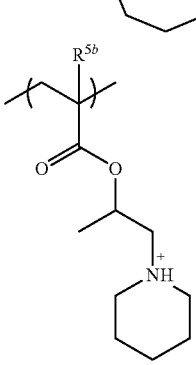
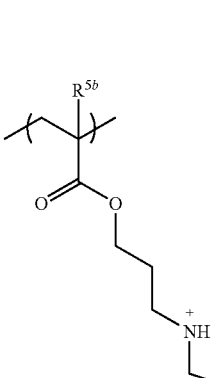

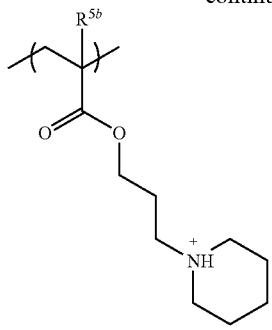

Herein $R^{5b}$ is as defined above.

Of the repeat units of formula (4a), those units containing a tertiary or lower ammonium salt may be obtained from neutralization reaction of a (meth)acrylate having an amino pendant group with a corresponding sulfonic acid. Those units containing a quaternary ammonium salt may be obtained from ion exchange reaction as is the quaternary ammonium salt (6) described above. In this case, the method of obtaining the repeat units of formula (4a) may be a sequence of neutralization or ion exchange reaction of a monomer followed by polymerization, or polymerization of a monomer followed by neutralization or ion exchange reaction.

Examples of the sulfonic acid salt used herein include fluoroalkylsulfonates such as triflate, 1,1,1-trifluoroethanesulfonate and nonafluorobutanesulfonate; arylsulfonates such as tosylate, benzenesulfonate, 4-fluorobenzenesulfonate, 1,2,3,4,5-pentafluorobenzenesulfonate, xylenesulfonate, mesitylenesulfonate, p-t-butylbenzenesulfonate, naphthalenesulfonate, anthracenesulfonate, and pyrenesulfonate; and alkylsulfonates such as mesylate, butanesulfonate, octanesulfonate, camphorsulfonate, adamantanesulfonate, norbornanesulfonate, cyclohexylsulfonate, cyclopentanesulfonate, cyclobutanesulfonate, cyclopropanesulfonate, and dodecylbenzenesulfonate.

Illustrative, non-limiting examples of the repeat units of formula (4b) are given below.

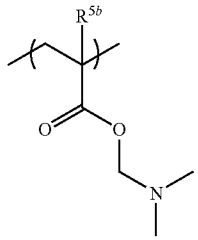

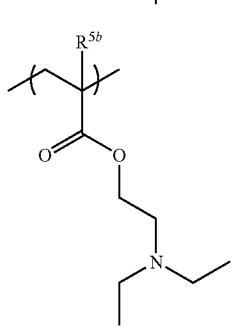

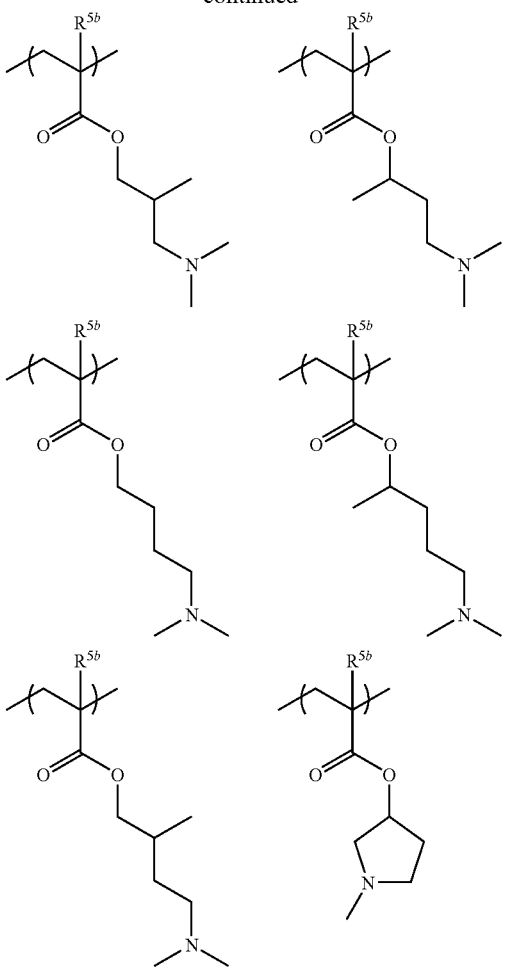

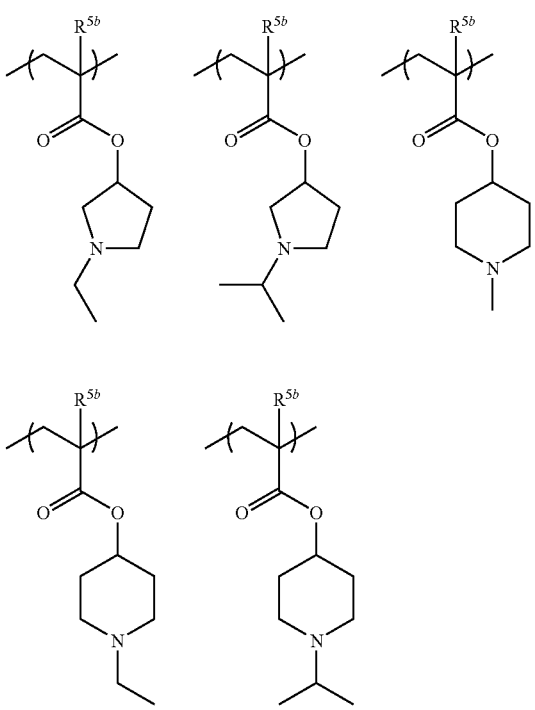

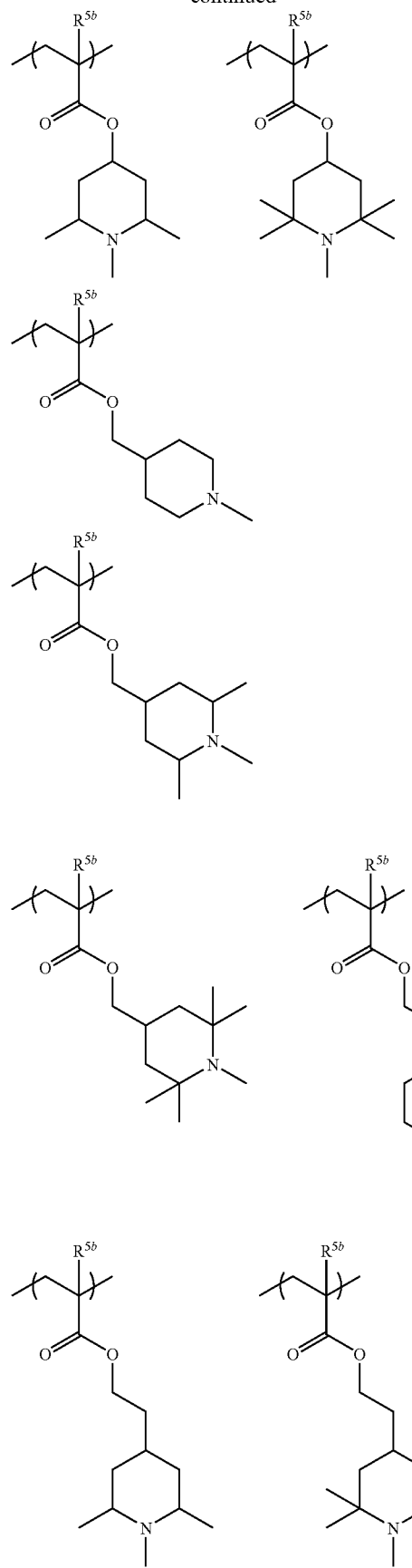
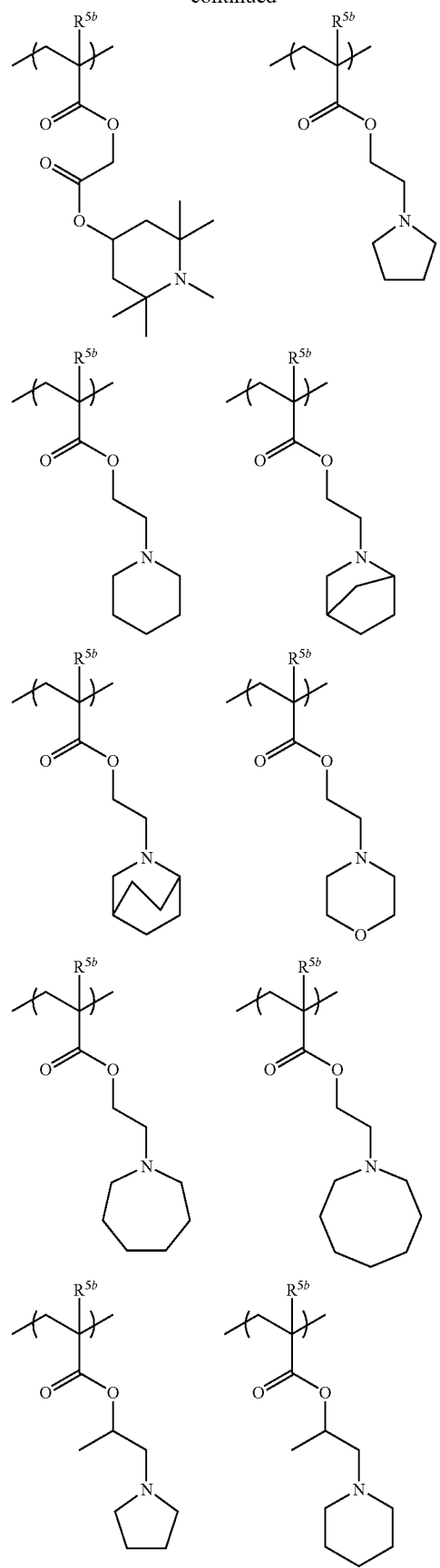

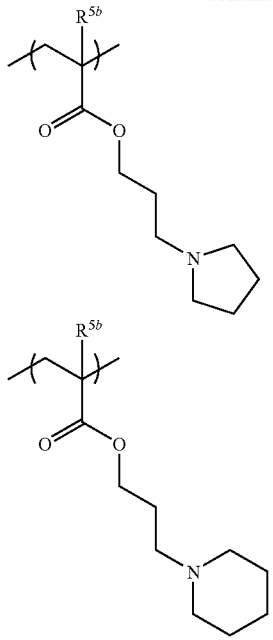

Herein R^(5b) is as defined above.

Note that where repeat units of formulae (3b) and (4b) are co-present, they may form an amine salt of sulfonic acid between molecules or within the molecule as shown below.

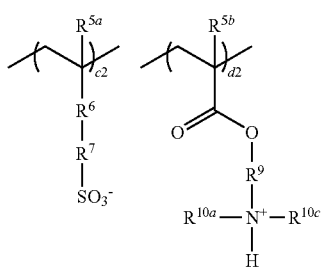

Herein $R^{5a}$, $R^{5b}$, $R^6$, $R^7$, $R^9$, $R^{10a}$, $R^{10c}$, c2 and d2 are as defined above.

With respect to the repeat units of formula (3a), a degree of neutralization between sulfo group and amine compound in an overall polymer may be such that with a less amine equivalent, sulfonic acid residues are present or inversely, amine is in excess. Where sulfonic acid residues are available, the protective coating, when combined with a photoresist, is effective for preventing bridges between features of a resist pattern after development. On the other hand, where an excess of amine is available, the protective coating is effective for improving the rectangularity of a resist pattern. With these considerations, the amounts of sulfo group and amine may be adjusted as appropriate while monitoring a resist pattern after development. The same applies to the repeat units of formula (4a).

In formula (5), exemplary straight, branched or cyclic $C_1$-$C_{10}$ alkyl groups represented by $R^{12a}$ and $R^{12b}$ include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl.

Illustrative, non-limiting examples of the repeat units of formula (5) are given below.

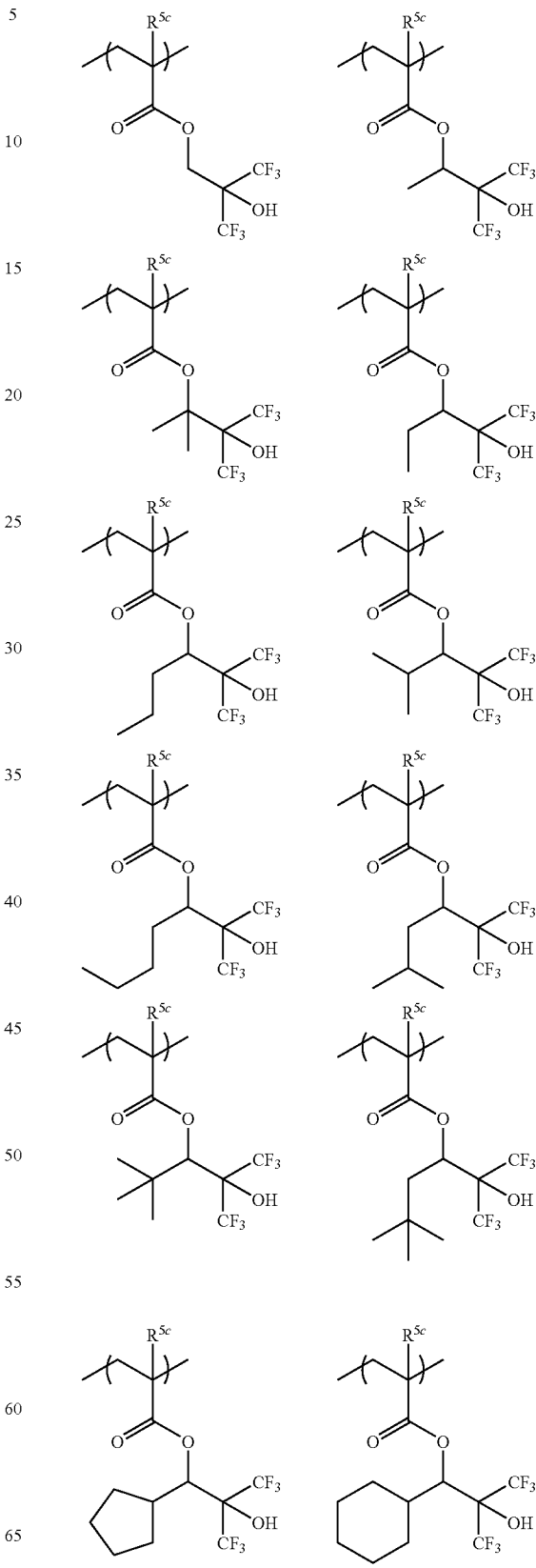

-continued

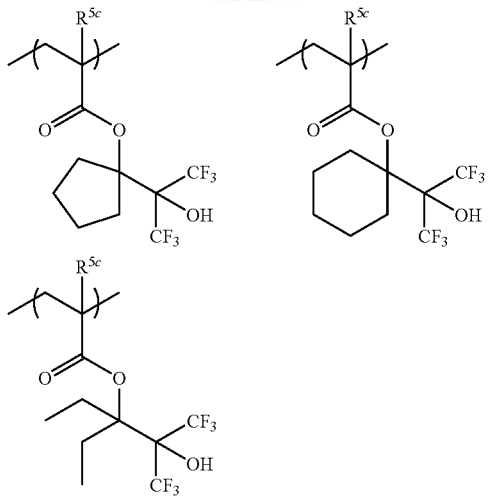

Herein $R^{5c}$ is as defined above.

In polymer PA used in the resist protective coating composition of the invention, the repeat unit of formula (1a) contributes to water repellency and alkali solubility since it contains a hexafluoroalcohol group. The repeat units of formulae (1b), (2a) and (2b) exert excellent performance in water repellency and water slip despite poor alkali solubility. Because of a combination of these units, Polymer PA exhibits excellent performance in water repellency and water slip.

It is believed that the regular arrangement of α-trifluoromethylacrylate structures and norbornene structures also contributes to the excellent water slip of polymer PA.

As discussed in the literature listed above, a water molecule orients via its oxygen atom upon interaction with a methyl group, whereas it orients via its hydrogen atom upon interaction with a trifluoromethyl group. It is reported in XXIV FATIPEC Congress Book, Vol. B, p 15 (1997) that the distances between H (methyl) and O (water molecule) and between F (trifluoromethyl) and H (water molecule) in these orientations are 0.252 nm and 0.187 nm, respectively. For better water slip performance, a longer orientation distance of a water molecule is advantageous. The above fact implies that mere introduction of fluorine into a resin fails to increase the orientation distance of a water molecule and does not lead to a dramatic improvement in water slip performance.

In contrast, in a system where methyl and trifluoromethyl groups are regularly arranged, for example, if one hydrogen atom of a water molecule orients to a trifluoromethyl group, the other hydrogen atom of water molecule is present in proximity to an adjacent methyl group, so that a repulsion force develops between H (methyl) and H (water molecule). As a result, the distance of orientation to water increases to provide an improvement in water slip performance. For the same reason, polymers having a regular arrangement of α-trifluoromethylacrylate structures and norbornene structures like polymer PA exhibit better water slip performance than polymers wherein trifluoromethyl groups are randomly distributed within the polymer structure (e.g., methacrylate polymers).

The scanning operation in the immersion lithography requires a high receding contact angle in order to prevent liquid droplets from being left backward of scanning and a low advancing contact angle in order to restrain microbubbles from being entrained forward of scanning. This necessitates a material having a little difference between advancing and receding contact angles. Polymer PA is believed promising as the base polymer for a protective coating in the immersion lithography since it offers so small a sliding angle of a water droplet that it causes little deformation of a water droplet and has a little difference between advancing and receding contact angles.

Since the repeat units of formulae (1a), (1b), (2a), and (2b) in polymer PA and the repeat units of formula (5) in polymer PB exhibit equivalent water repellency, polymers PA and PB may be mixed and dissolved in a common solvent. On the other hand, the repeat units of formulae (3a), (3b), (4a), and (4b) in polymer PB exhibit high hydrophilicity. Thus, when a blend of polymers PA and PB is used as the resist protective coating composition, a film consisting of two vertically separated layers is formed. Specifically, the hydrophobic polymer PA is distributed (or segregated) in the upper layer (immersion water side) whereas the hydrophilic polymer PB is distributed in the lower layer (resist film side).

Since polymer PA exhibits excellent performance in water repellency and water slip, but has lower alkali solubility and hydrophilicity than polymer PB, polymer PA used alone tends to invite blob defects. In contrast, polymer PB has so high hydrophilicity that it tends to segregate on the resist side during spin coating, which turns the resist surface after development to be hydrophilic. As a result, a blend of polymers PA and PB facilitates enlargement of bridge margin and reduction of blob defects, making it possible to form a pattern of rectangular profile.

In order that polymer PB segregate on the resist side, a proportion of hydrophilic repeat units of formulae (3a), (3b), (4a) and (4b) must be increased. However, if a proportion of sulfo-containing repeat units (3b) is high, then there is an increased possibility that deprotection reaction of acid labile groups proceeds near the resist surface during PEB step, allowing the resist film to be slimmed at its surface. If a proportion of repeat units (3a) and (4a) containing sulfonic acid amine salt is high, then solvent solubility becomes lower. If amino groups in amino-containing repeat units (4b) are strongly basic, there is a likelihood of a resist pattern after development becoming T-topped. Then, in order for polymer PB to effectively segregate on the resist side, it is necessary to find an optimum proportion among repeat units of formulae (3a), (3b), (4a), (4b) and (5) to be copolymerized.

Where polymer PB contains repeat units of formula (3b), the resist surface becomes more hydrophilic as the resist film is slimmed as pointed out above, and hence, bridge defects and blob defects are reduced. However, if the top of a line pattern is slimmed, this may lead to a failure to ensure necessary etch resistance. Such film slimming can be prevented by reducing a proportion of repeat units of formula (3b), while another effective means is to introduce repeat units of formulae (3a) and (4a) having a sulfonic acid amine salt. Since the sulfonic acid amine salt is more hydrophilic than the sulfonic acid, use of such polymer PB in blend with polymer PA leads to an increased likelihood that polymer PB segregates on the resist side, resulting in distinct layer separation of the film in the depth direction. As a consequence, the resist protective coating becomes more water repellent on its surface, and the resist surface becomes more hydrophilic.

Where polymer PB contains repeat units (3a) and (4a) having a sulfonic acid amine salt, application of a strongly basic tertiary alkyl amine is more effective for achieving an improvement in rectangularity of resist pattern, though at the risk of inviting bridge defects and blob defects. This necessitates to set a proportion of repeat units (3a) and (4a) at a relatively low level. When a weakly basic nitrogen-containing compound such as amino acid is applied, it achieves a modest improvement in resist pattern, but the risk of inviting bridge defects and blob defects is reduced. This necessitates to set a proportion of repeat units (3a) and (4a) at a relatively high level to enable formation of a pattern of rectangular profile. As discussed above, by an adjustment of the basicity strength and addition amount of amine to be applied, a resist protective coating for immersion lithography can be constructed which leads to high rectangularity and elimination of bridge defects and blob defects.

Although polymers PA and PB used in the resist protective coating composition of the invention may exert satisfactory performance by a combination of repeat units of formulae (1a), (1b), (2a), (2b), (3a), (3b), (4a), (4b), and (5), they may also be constructed by further combining with repeat units of one or more type of the general formulae (7a) to (7e), (8a) to (8e), (9a) to (9c), and (10a) to (10c), shown below, for the purposes of imparting additional water repellency and water slip and controlling alkali solubility and developer affinity.

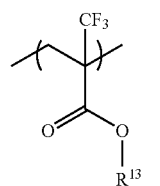
(7a)

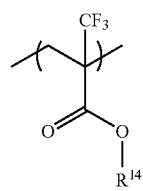
(7b)

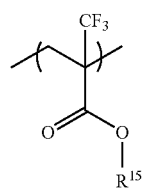
(7c)

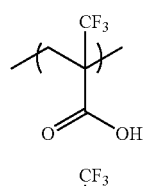
(7d)

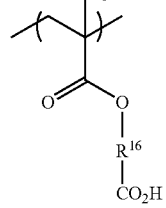
(7e)

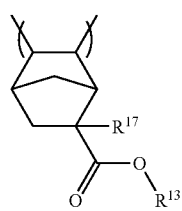
(8a)

-continued

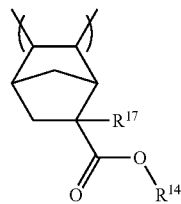
(8b)

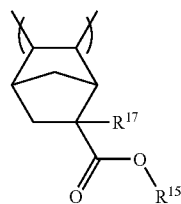
(8c)

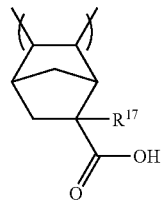
(8d)

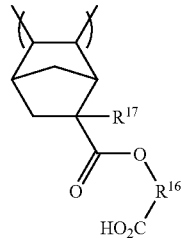
(8e)

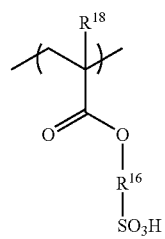
(9a)

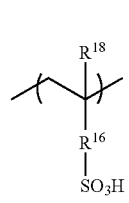
(9b)

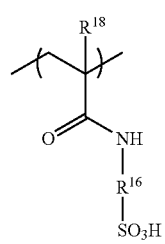
(9c)

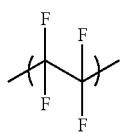
(10a)

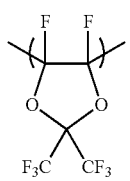
(10b)

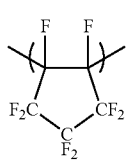
(10c)

Herein $R^{13}$ is $C_1$-$C_{10}$ alkyl or fluoroalkyl; $R^{14}$ is an adhesive group; $R^{15}$ is an acid labile group; $R^{16}$ is a single bond or a divalent $C_1$-$C_{10}$ organic group; $R^{17}$ and $R^{18}$ are each hydrogen, methyl or trifluoromethyl.

In formulae (7a) and (8a), exemplary $C_1$-$C_{10}$ alkyl groups represented by $R^{13}$ include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. Suitable fluoroalkyl groups represented by $R^{13}$ include the above-exemplified alkyl groups in which some or all hydrogen atoms are substituted by fluorine atoms, such as, for example, 2,2,2-trifluoroethyl, 3,3,3-trifluoropropyl, 1,1,2,2,3,3,3-heptafluoropropyl, 1H,1H,3H-tetrafluoropropyl, 1H,1H,5H-octafluoropentyl, 1H,1H,7H-dodecafluoroheptyl, 2-(perfluorobutyl)ethyl, 2-(perfluorohexyl)ethyl, 2-(perfluorooctyl)ethyl, and 2-(perfluorodecyl)ethyl.

In formulae (7b) and (8b), the adhesive group represented by $R^{14}$ may be selected from a variety of such groups, typically those groups shown below.

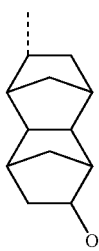
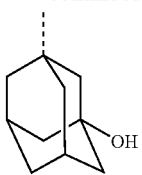
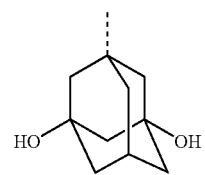

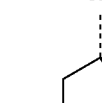

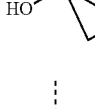
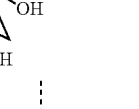

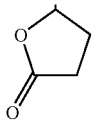
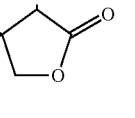

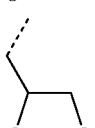

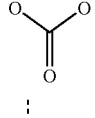
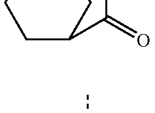

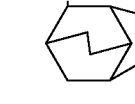

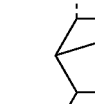
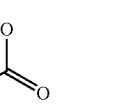

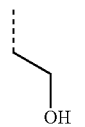
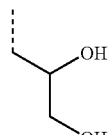
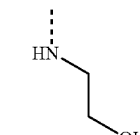
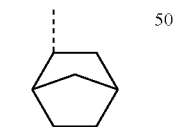

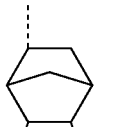
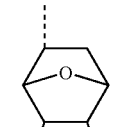
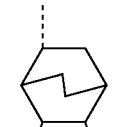

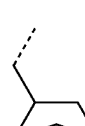
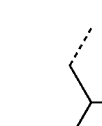
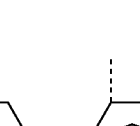
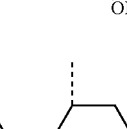

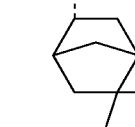
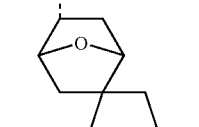

-continued

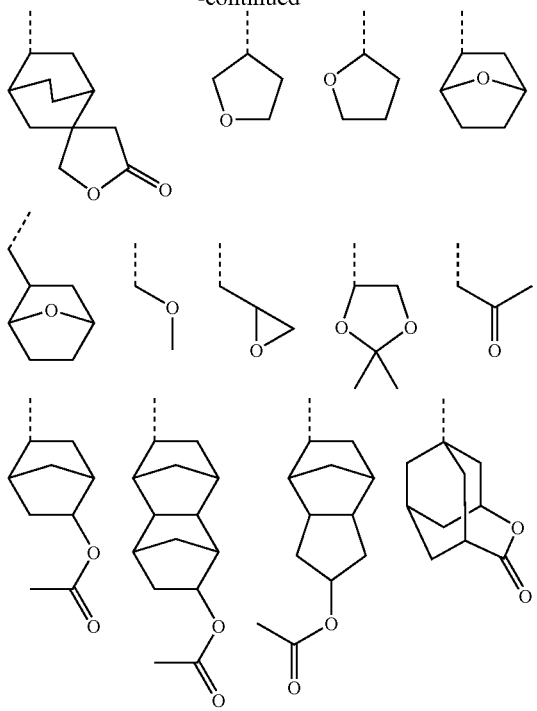

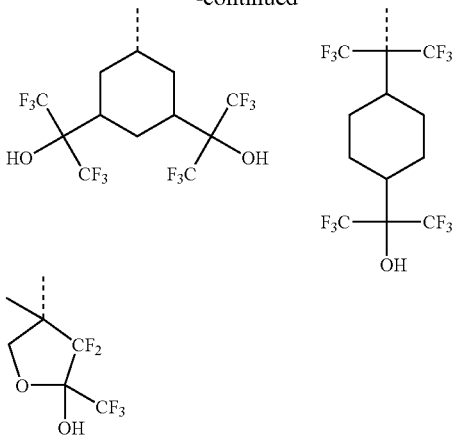

Herein, the broken line designates a valence bond.

In formulae (7c) and (8c), the acid labile group represented by $R^{15}$ may be selected from those groups illustrated for $R^3$.

In formulae (7e), (8e), and (9a) to (9c), suitable divalent organic groups represented by $R^{16}$ include alkylene groups such as methylene and groups of the following formulae.

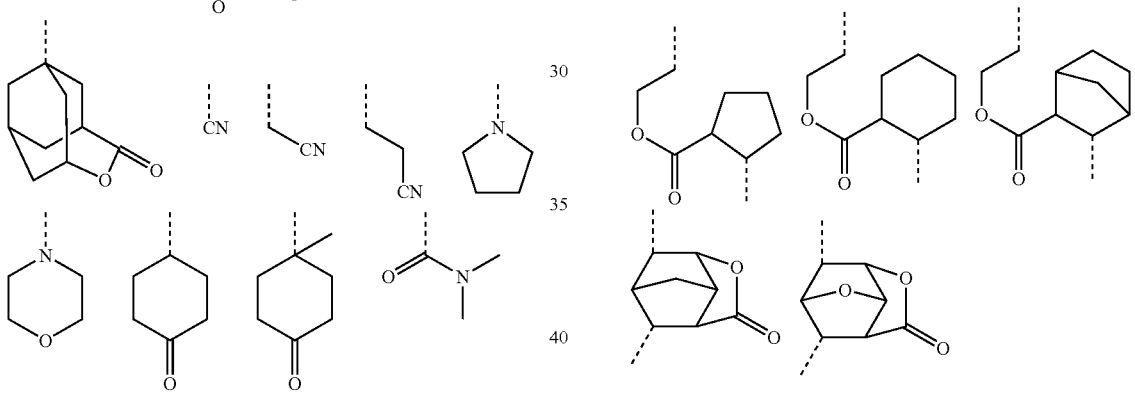

Herein, the broken line designates a valence bond.

The polymers PA and PB used in the protective coating composition may be synthesized by general polymerization processes including radical polymerization using initiators such as 2,2'-azobisisobutyronitrile (AIBN), and ionic (or anionic) polymerization using alkyllithium or the like. The polymerization may be carried out by its standard technique. Preferably the polymers are prepared by radical polymerization while the polymerization conditions may be determined in accordance with the type of initiator, temperature, pressure, concentration, solvent, additives, and the like.

Examples of the radical polymerization initiator used herein include azo compounds such as 2,2'-azobisisobutyronitrile (AIBN), 2,2'-azobis(4-methoxy-2,4-dimethylvaleronitrile), 2,2'-azobis(2,4-dimethylvaleronitrile), 2,2'-azobis(2,4,4-trimethylpentane), and dimethyl 2,2'-azobis(isobutyrate); peroxides such as tert-butylperoxypivalate, lauroyl peroxide, benzoyl peroxide, and tert-butylperoxylaurate; water-soluble polymerization initiators such as potassium persulfate; and redox initiators comprising a peroxide (e.g., potassium persulfate or hydrogen peroxide) combined with a reducing agent (e.g., sodium sulfite). Although the amount of polymerization initiator used may vary with its type and other polymerization conditions, it is generally used

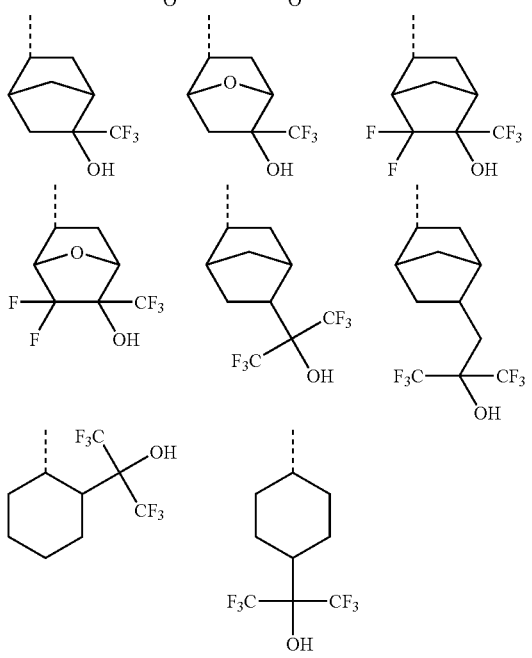

in an amount of 0.001 to 10 mol %, and preferably 0.01 to 5 mol % based on the total moles of monomers to be polymerized.

During the synthesis of polymer PA or PB, any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

While polymer PA or PB may be synthesized by combining suitable monomers selected from polymerizable monomers corresponding to repeat units of formulae (1a), (1b), (2a), (2b), (3a), (3b), (4a), (4b), (5), (7a) to (7e), (8a) to (8e), (9a) to (9c), and (10a) to (10c), adding an initiator and chain transfer agent to the monomer mixture, and effecting polymerization, a solvent may be used if necessary. Any solvent may be used as long as it does not interfere with the desired polymerization reaction. Typical solvents used herein include esters such as ethyl acetate, n-butyl acetate, and γ-butyrolactone; ketones such as acetone, methyl ethyl ketone, and methyl isobutyl ketone; aliphatic or aromatic hydrocarbons such as toluene, xylene and cyclohexane; alcohols such as isopropyl alcohol and ethylene glycol monomethyl ether; and ether solvents such as diethyl ether, dioxane, and tetrahydrofuran, which may be used alone or in admixture. Although the amount of solvent used may vary with the desired degree of polymerization (or molecular weight), the amount of initiator added, and other polymerization conditions such as polymerization temperature, it is generally used in such an amount as to provide a concentration of 0.1 to 95% by weight, preferably 5 to 90% by weight of monomers to be polymerized.

Although the temperature of the polymerization reaction may vary with the identity of polymerization initiator or the boiling point of solvent, it is preferably in the range of 20 to 200° C., and more preferably 50 to 140° C. Any desired reactor or vessel may be used for the polymerization reaction.

From the solution or dispersion of the polymer thus synthesized, the organic solvent or water serving as the reaction medium is removed by any well-known techniques. Suitable techniques include, for example, re-precipitation followed by filtration, and heat distillation under vacuum.

Polymer P2 used herein may be synthesized by synthesizing a polymer P1-H comprising repeat units of formulae (1a) and (2a'), then effecting post-protection reaction to substitute for some or all hydroxyl groups.

P1-H

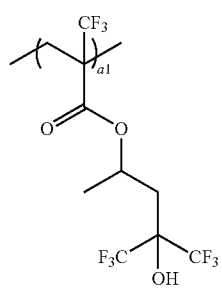
(1a)

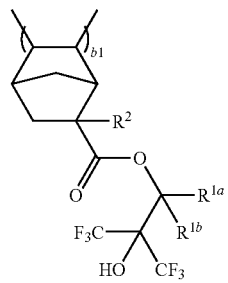
(2a')

Herein, $R^{1a}$, $R^{1b}$, $R^2$, a1 and b1 are as defined above.

Polymer P2 is obtainable by reacting polymer P1-H with a base in an amount of 1 to 2 equivalents relative to the desired degree of substitution of hydroxyl groups, and then with R—X (wherein R is an acid labile group or alkyl as mentioned above and X is chlorine, bromine or iodine) in an amount of 1 to 2 equivalents relative to the base.

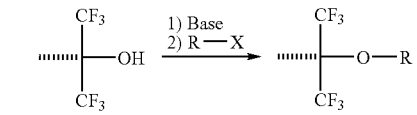

The post-protection reaction may be effected in a solvent, which is selected from hydrocarbons such as benzene and toluene, and ethers such as dibutyl ether, diethylene glycol diethyl ether, diethylene glycol dimethyl ether, tetrahydrofuran and 1,4-dioxane, alone or in admixture. Suitable bases used herein include, but are not limited to, sodium hydride, n-butyllithium, lithium diisopropylamide, triethylamine, and pyridine.

Desirably polymers PA and PB have a weight average molecular weight (Mw) of 1,000 to 500,000, and especially 2,000 to 30,000, as determined by gel permeation chromatography (GPC) using polystyrene standards. This is because a polymer with too low a Mw may be miscible with the resist material or more dissolvable in water whereas too high a Mw may interfere with film formation after spin coating and lead to a decline of alkali solubility.

In polymer PA wherein U1 stands for a total molar number of a monomer corresponding to units of formula (1a), U2 stands for a total molar number of a monomer corresponding to units of formula (1b), U3 stands for a total molar number of a monomer corresponding to units of formula (2a), and U4 stands for a total molar number of a monomer corresponding to units of formula (2b), with the proviso that U1+U2+U3+U4=UA, values of U1, U2, U3 and U4 are preferably determined so as to meet:

0≦U1/UA<1, more preferably 0.2≦U1/UA≦0.7, even more preferably 0.3≦U1/UA≦0.7,

0≦U2/UA<1, more preferably 0.1≦U2/UA≦0.7, even more preferably 0.1≦U2/UA≦0.5,

0≦U3/UA<1, more preferably 0.1≦U3/UA≦0.6, even more preferably 0.1≦U3/UA≦0.5, and 0≦U4/UA<1, more preferably 0≦U4/UA≦0.7, even more preferably 0.1≦U4/UA≦0.5.

In the embodiment wherein additional repeat units of formulae (7a) to (7e), (8a) to (8e), (9a) to (9c), (10a) to (10c) are incorporated into the polymers for the purpose of improving their function in the resist protective coating composition, provided that U5 stands for a total molar number of monomers corresponding to the additional units and U1+U2+U3+U4+U5=UA', a ratio of UA to UA' is preferably determined so as to meet 0<UA/UA'≦1, more preferably 0.6<UA/UA'≦1, and even more preferably 0.8≦UA/UA'≦1.

In polymer PB wherein U6a stands for a total molar number of a monomer corresponding to units of formula (3a), U6b stands for a total molar number of a monomer corresponding to units of formula (3b), U7a stands for a total molar number of a monomer corresponding to units of formula (4a), U7b stands for a total molar number of a monomer corresponding to units of formula (4b), and U8 stands for a total molar number of a monomer corresponding to units of formula (5), with the proviso that U6a+U6b+U7a+U7b+U8=UB, values of U6a, U6b, U7a, U7b and U8 are preferably determined so as to meet:

0≦U6a/UB<1, more preferably 0≦U6a/UB≦0.5, even more preferably 0≦U6a/UB≦0.3,

0≦U6b/UB<1, more preferably 0≦U6b/UB≦0.5, even more preferably 0≦U6b/UB≦0.3,

0≦U7a/UB<1, more preferably 0≦U7a/UB≦0.5, even more preferably 0≦U7a/UB≦0.3,

0≦U7b/UB<1, more preferably 0≦U7b/UB≦0.5, even more preferably 0≦U7b/UB≦0.3, and 0<U8/UB<1, more preferably 0.5≦U8/UB<1, even more preferably 0.7≦U8/UB<1.

In the embodiment wherein additional repeat units of formulae (7a) to (7e), (8a) to (8e), (10a) to (10c) are incorporated into the polymers for the purpose of improving their function in the resist protective coating composition, provided that U9 stands for a total molar number of monomers corresponding to the additional units and U6+U7+U8+U9=UB' (U6=U6a+U6b, U7=U7a+U7b), a ratio of UB to UB' is preferably determined so as to meet 0<UB/UB'≦1, more preferably 0.6<UB/UB'≦1, and even more preferably 0.8≦UB/UB'≦1.

The polymers PA and PB independently have a weight average molecular weight (Mw) of 3,000 to 500,000, and preferably 4,000 to 20,000, as measured by gel permeation chromatography (GPC) relative to polystyrene.

While polymer PA and polymer PB may be mixed at any desired ratio, polymer PA is typically present in a weight ratio of 5 to 95%, preferably 20 to 93%, and more preferably 30 to 90% based on the entire resins.

Typically the polymer defined above is used as a base resin in a protective coating composition for immersion lithography while another polymer may be mixed therewith for the purpose of altering some properties of a protective coating such as dynamic physical properties, thermal properties, alkali solubility, water repellency, and water slip. Although the other polymer which is mixed is not particularly limited, any of well-known polymers useful in the protective topcoat application may be chosen and mixed in any desired ratio.

Most often, the polymer is dissolved in a suitable solvent to form a solution which is ready for use as the resist protective coating composition. For film formation by spin coating technique, the solvent is preferably used in such amounts to provide a concentration of 0.1 to 20% by weight, more preferably 0.5 to 10% by weight of the polymer.

Although the solvent used herein is not particularly limited, those solvents in which resist layers are not dissolvable are preferred. Suitable solvents in which resist layers are not dissolvable include nonpolar solvents, for example, higher alcohols of at least 4 carbon atoms, toluene, xylene, anisole, hexane, cyclohexane, decane, and ethers. Of these, higher alcohols of at least 4 carbon atoms and ether compounds of 8 to 12 carbon atoms are most desirable. Examples of suitable solvents include, but are not limited to, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol as well as diisopropyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, and di-n-hexyl ether. These solvents may be used alone or in admixture.

Water repellent polymers PA are readily dissolvable in ether solvents whereas hydrophilic polymers PB are dissolvable in ether solvents and more readily dissolvable in alcohol solvents. It is then preferred to use an ether solvent in combination with an alcohol solvent to ensure that both the polymers are dissolved.

Fluorinated solvents are also preferred because resist layers are not dissolvable therein. Examples include, but are not limited to, 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro(2,5-dimethyl-3,6-dioxane anionic) acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, 1,1,1-trifluoro-5,5-dimethyl-2,4-hexanedione, 1,1,1,3,3,3-hexafluoro-2-propanol, 1,1,1,3,3,3-hexafluoro-2-methyl-2-propanol, 2,2,3,4,4,4-hexafluoro-1-butanol, 2-trifluoromethyl-2-propanol, 2,2,3,3-tetrafluoro-1-propanol, 3,3,3-trifluoro-1-propanol, and 4,4,4-trifluoro-1-butanol, which may be used alone or in admixture.

Process

It is now described how to form patterns using a resist composition and the resist protective coating composition of the invention which is water-insoluble and alkali-soluble.

The pattern forming process in a preferred embodiment involves at least the steps of forming a photoresist film on a substrate, forming a protective coating on the photoresist film from the resist protective coating composition of the invention, exposing the layer structure to light, and development with a developer.

First a photoresist material is applied onto a substrate and prebaked to form a photoresist film thereon. The protective coating solution is then applied onto the photoresist film by spin coating, and prebaked on a hot plate at 50 to 150° C. for 1 to 10 minutes, preferably at 70 to 140° C. for 1 to 5 minutes, to form a protective coating. The protective coating preferably has a thickness of 10 to 500 nm. If the protective coating solution is spin coated onto the surface of the resist film which has been wetted with a suitable solvent, the amount of the protective coating solution dispensed may be reduced. The means of wetting the resist surface include spin coating and vapor priming, with the spin coating technique being often employed. The solvent used for wetting may be selected from the aforementioned higher alcohols, ethers, and fluorinated solvents in which the resist is not dissolved.

A mask having the desired pattern is then placed over the photoresist film, and the film exposed through the mask to an electron beam or to high-energy radiation such as deep-UV, excimer laser or x-ray in a dose of 1 to 200 mJ/cm$^2$, and preferably 10 to 100 mJ/cm$^2$. Light exposure is preferably by immersion lithography of providing a liquid between the protective coating and the projection lens, though not limited thereto. The exposure may be either dry exposure in air or nitrogen atmosphere or vacuum exposure as in the case of EB or EUV lithography. In the immersion lithography, a light source producing emission having a wavelength in the range of 180 to 250 nm is preferred, and water is preferably used as the liquid between the protective coating and the lens.

In the immersion lithography, whether or not the wafer edge and rear side are cleaned and the cleaning technique are important in preventing flowing of water to the wafer rear side and leaching from the substrate. For example, after spin coating, the resist protective coating is baked at a temperature of 40 to 130° C. for 10 to 300 seconds for evaporating off the solvent. In the case of resist layer formation and dry lithography, edge cleaning is performed during the spin coating. In the case of immersion lithography, however, such edge cleaning is undesirable because water may be left on the hydrophilic substrate surface at the edge. It is then recommended to omit edge cleaning during the spin coating of the resist protective coating.

Exposure is followed by post-exposure bake (PEB) on a hot plate at 60 to 150° C. for 1 to 5 minutes, preferably at 80 to 140° C. for 1 to 3 minutes. Sometimes water is left on the protective coating prior to PEB. If PEB is performed in the presence of residual water, water can penetrate through the protective coating to suck up the acid in the resist, impeding pattern formation. Such inconvenience must be avoided by fully removing the water on the protective coating prior to PEB. The water on the protective coating should be dried or recovered by suitable means, for example, spin drying, purging of the protective coating surface with dry air or nitrogen, or optimizing the water recovery nozzle configuration on a stage or water recovery process. Additionally, the design and utilization of a material having high water repellency and water slip, typically the protective coating composition of the invention, offers the advantage of efficient water removal.

After PEB, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray development for a period of 10 to 300 seconds, and preferably 0.5 to 2 minutes. A typical developer is a 2.38 wt % TMAH aqueous solution. These steps result in the formation of the desired pattern on the substrate. Where the resist protective coating composition is used, the protective coating composition itself exhibits alkaline solubility so that the protective coating can be stripped at the same time as development.

Where a pattern is formed using the protective coating composition, the resist material of which the underlying resist layer is made is not particularly limited. The resist type may be either positive or negative working and also either a monolayer resist of conventional hydrocarbon or a bilayer (or multilayer) resist containing silicon atoms or the like.

For KrF lithography resist materials, the preferred base resins are polyhydroxystyrene or polyhydroxystyrene-(meth)acrylate copolymers in which some or all hydrogen atoms of hydroxyl or carboxyl groups are replaced by acid labile groups.

For ArF lithography resist materials, the preferred base resin has an aromatic-free structure. Illustrative polymers include (meth)acrylic derivative copolymers, norbornene derivative-maleic anhydride alternating copolymers, norbornene derivative-maleic anhydride-(meth)acrylic derivative copolymers, tetracyclododecene derivative-maleic anhydride alternating copolymers, tetracyclododecene derivative-maleic anhydride-(meth)acrylic derivative copolymers, norbornene derivative-maleimide alternating copolymers, norbornene derivative-maleimide-(meth)acrylic derivative copolymers, tetracyclododecene derivative-maleimide derivative alternating copolymers, tetracyclododecene derivative-maleimide derivative-(meth)acrylic derivative copolymers, polynorbornene derivatives, and ring-opening metathesis polymerization (ROMP) polymers, and a combination of any.

A polymer comprising repeat units containing aromatic ring could not be used initially as the ArF lithography resist since it has absorption at wavelength 193 nm. As the resist film becomes thinner, the influence of absorption is mitigated, indicating the potential of such a polymer being applied to the ArF lithography. Also, since the reflection of oblique incident light from the substrate increases when a projection lens has a NA in excess of 1, it is proposed to positively utilize the absorptive aromatic ring for suppressing reflection from the substrate. Polymers useful in this case include copolymers of hydroxyvinylnaphthalene having naphthalene ring, methacrylates containing vinyl naphthalene, acenaphthylene and naphthol as side chains, methacrylates containing hydroxystyrene and naphthol as side chains, fluorinated hydroxystyrene, fluoroalkylhydroxystyrene, fluorinated styrene, fluoroalkylstyrene, hexafluoroisopropanolstyrene, and hexafluoroisopropanolindene.

A further aspect of the invention provides a pattern forming process involving the steps of forming a photoresist layer on a mask blank, forming a protective coating on the photoresist layer from the resist protective coating composition of the invention, effecting electron beam exposure in vacuum, and development.

Where a resist material is used with mask blanks, novolac resins and hydroxystyrene are often used as the base resin. Those resins in which alkali-soluble hydroxyl groups are substituted by acid labile groups are used for positive resists while these resins in combination with crosslinking agents are used for negative resists. Base polymers which can be used herein include copolymers of hydroxystyrene with one or more of (meth)acrylic derivatives, styrene, vinyl naphthalene, vinyl anthracene, vinyl pyrene, hydroxyvinyl naphthalene, hydroxyvinyl anthracene, indene, hydroxyindene, acenaphthylene, norbornadiene, coumarone, and chromone.

Where the polymer is used as a resist protective coating for use with mask blanks, a photoresist is coated on a mask blank substrate of $SiO_2$, Cr, CrO, CrN, MoSi or the like before a protective coating is formed thereon using the polymer. By further forming a SOG film and an organic undercoat film between the photoresist and the blank substrate, there is provided a three-layer structure which is also acceptable herein. Once the protective coating is formed, the structure is exposed to EB in vacuum using an EB image-writing system. The exposure is followed by post-exposure baking (PEB) and development in an alkaline developer for 10 to 300 seconds.

EXAMPLE

Examples of the invention are given below by way of illustration and not by way of limitation. The abbreviations used herein are GPC for gel permeation chromatography, NMR for nuclear magnetic resonance, Mw for weight average molecular weight, Mn for number average molecular weight, and Mw/Mn for molecular weight dispersity. Mw and Mn are determined by GPC versus polystyrene standards.

Polymer Synthesis Example

Monomers 1 to 14 used in Polymer Synthesis Examples are identified below by their structural formula.

Monomer 1

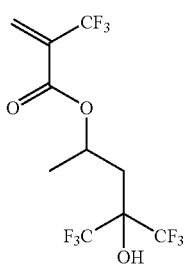

Monomer 2

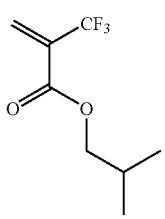

Monomer 3

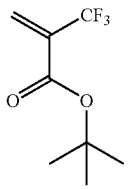

Monomer 4

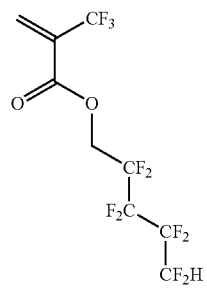

Monomer 5

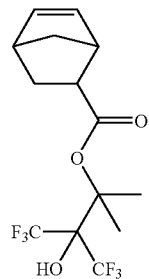

Monomer 6

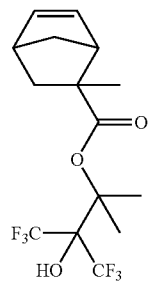

Monomer 7

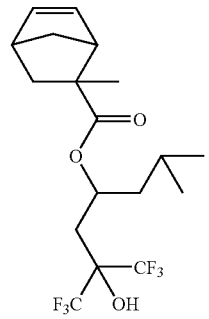

Monomer 8

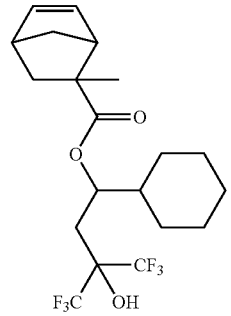

-continued

Monomer 9
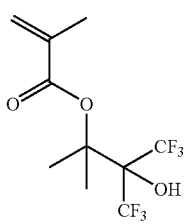

Monomer 10
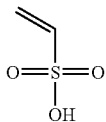

Monomer 11
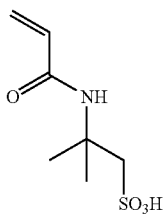

Monomer 12
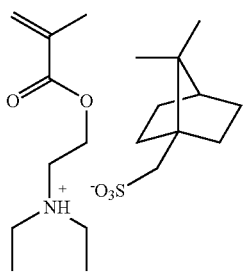

Monomer 13
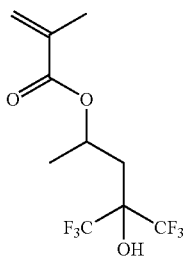

Monomer 14
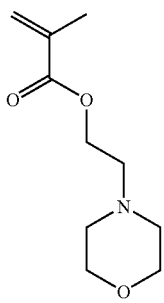

Polymer Synthesis Example 1
Copolymerization of Monomers 1, 2 and 6 (40/30/30)

To a flask in a nitrogen blanket, 45.94 g of Monomer 1, 19.30 g of Monomer 2, 35.55 g of Monomer 6, and 42.9 g of γ-butyrolactone were fed to form a monomer solution, which was kept at a temperature of 20-25° C. With stirring, the solution was heated to 60° C., whereupon 4.51 g of dimethyl 2,2'-azobis(isobutyrate) was added. The polymerization solution was continuously stirred for 24 hours while keeping the temperature at 60° C. At the end of maturing, the solution was cooled to room temperature. To the polymerization solution thus obtained, 300 g of diisopropyl ether and 300 g of ultrapure water were added, followed by 15 minutes of stirring. The water layer was discarded, and the organic layer was washed three times with 300 g of water. The organic layer was concentrated and added dropwise to 1,500 g of hexane. The precipitated copolymer was separated and washed twice with 600 g of hexane, whereupon white solids were isolated. The white solids were vacuum dried at 50° C. for 24 hours, obtaining 53.6 g of the target polymer, Polymer 1. The resin was analyzed for composition by $^1$H-NMR, finding that the copolymer consisted of Monomers 1, 2 and 6 in a ratio of 53/29/18 mol %. The copolymer was also analyzed for molecular weight by GPC, finding Mw of 7,100 and Mw/Mn of 1.4.

Polymer Synthesis Examples 2 to 6

Like Polymer 1, Polymers 2 to 6 were synthesized in accordance with the formulation shown in Table 1 and analyzed by GPC. The results are shown in Table 1.

TABLE 1

| (mol %) | Monomer | | | | | | | | Mw | Mw/Mn |
| --- | --- | --- | --- | --- | --- | --- | --- | --- | --- | --- |
| | 1 | 2 | 3 | 4 | 5 | 6 | 7 | 8 | | |
| Polymer 1 | 40 | 30 | | | | 30 | | | 7,100 | 1.4 |
| 2 | 40 | 30 | | 30 | | | | | 6,700 | 1.4 |
| 3 | 70 | | | | | | 30 | | 7,500 | 1.4 |
| 4 | 70 | | | | | | | 30 | 7,600 | 1.4 |
| 5 | 40 | | 30 | | | 30 | | | 7,200 | 1.4 |
| 6 | 50 | | | 20 | | 30 | | | 7,300 | 1.4 |

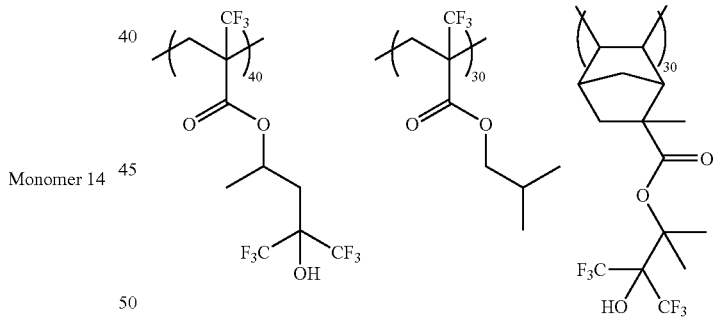

Polymer 1

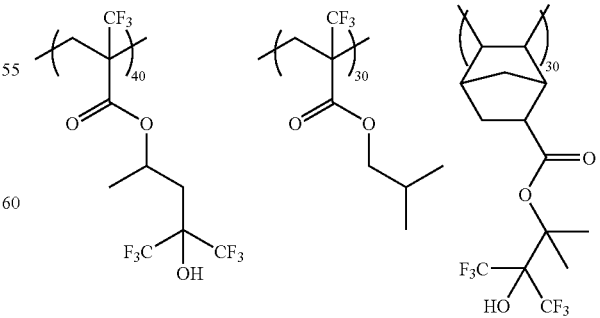

Polymer 2

TABLE 1-continued

| | Monomer | | | | | | | | | |
|---|---|---|---|---|---|---|---|---|---|---|
| (mol %) | 1 | 2 | 3 | 4 | 5 | 6 | 7 | 8 | Mw | Mw/Mn |

Polymer 3

Polymer 4

Polymer 5

Polymer 6

Polymer Synthesis Example 7
Copolymerization of Monomers 1 and 6 (70/30) and Post-Protection Reaction To a flask in a nitrogen blanket, 73.28 g of Monomer 1, 30.42 g of Monomer 6, and 42.9 g of γ-butyrolactone were fed to form a monomer solution, which was kept at a temperature of 20-25° C. With stirring, the solution was heated to 60° C., whereupon 3.47 g of dimethyl 2,2'-azobis(isobutyrate) was added. The polymerization solution was continuously stirred for 24 hours while keeping the temperature at 60° C. At the end of maturing, the solution was cooled to room temperature. To the polymerization solution thus obtained, 300 g of diisopropyl ether and 300 g of ultra-pure water were added, followed by 15 minutes of stirring. The water layer was discarded, and the organic layer was washed three times with 300 g of water. The organic layer was concentrated and added dropwise to 1,500 g of hexane. The precipitated copolymer was separated and washed twice with 600 g of hexane, whereupon white solids were isolated. The white solids were vacuum dried at 50° C. for 24 hours, obtaining 50.6 g of the target polymer, Polymer 7'. The resin was analyzed for composition by $^1$H-NMR, finding that the copolymer consisted of Monomers 1 and 6 in a ratio of 72/28 mol %. The copolymer was also analyzed for molecular weight by GPC, finding Mw of 9,000 and Mw/Mn of 1.4.

Next, in a nitrogen atmosphere, a 50 g portion of Polymer 7' was dissolved in 200 g of tetrahydrofuran. With the flask in an ice bath, 4.6 g of triethylamine and 4.6 g of 1-chloro-1-methoxy-2-methylpropane were added to the solution, which was continuously stirred for 10 hours at room temperature. To the flask, 100 g of diisopropyl ether and 150 g of water were added, followed by stirring. After the water layer was separated off, the organic layer was concentrated. The concentrate was added dropwise to 750 g of hexane. The precipitated copolymer was separated and washed twice with 300 g of hexane, whereupon white solids were isolated. The white solids were vacuum dried at 50° C. for 24 hours, obtaining 44.1 g of the target polymer, Polymer 7. The resin was analyzed for percent protection of hydroxyl groups by $^1$H-NMR, finding that 28% of overall hydroxyl groups had been substituted by 1-methoxy-2-methylpropyl groups. The copolymer was also analyzed for molecular weight by GPC, finding Mw of 9,200 and Mw/Mn of 1.4.

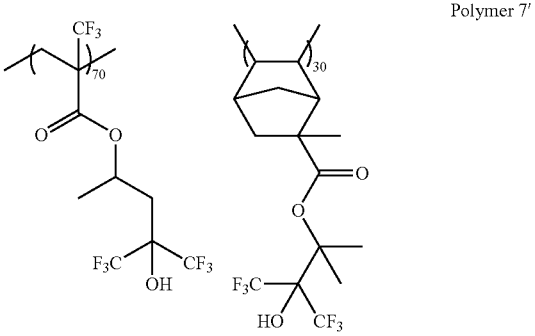

Polymer 7'

Polymer Synthesis Example 8
Copolymerization of Monomers 9 and 10 (90/10) in the Co-Presence of Base 1

To a flask in a nitrogen blanket, 96.46 g of Monomer 9, 4.03 g of Monomer 10, 1.87 g of Base 1 (shown below), 4.18 g of dimethyl 2,2'-azobis(isobutyrate), and 155.56 g of isopropyl alcohol were fed to form a monomer solution, which was kept at a temperature of 20-25° C. To another flask in a nitrogen blanket, 77.78 g of isopropyl alcohol was fed. With stirring, it was heated to 80° C., to which the monomer solution was added dropwise over 4 hours. After the completion of dropwise addition, the polymerization solution was continuously stirred for 2 hours while keeping the temperature at 80° C. At the end of maturing, the solution was cooled to room temperature. To the polymerization solution thus obtained, 300 g of diisopropyl ether and 3,000 g of ultra-pure water were added, followed by 10 minutes of stirring. The water layer was separated, and the organic layer was washed twice with 300 g of ultra-pure water. The organic layer was concentrated until the total weight of the solution was reduced to 200 g, and added dropwise to 1,500 g of hexane. The precipitate was separated and washed with 600 g of hexane, whereupon white solids were vacuum dried at 50° C. for 20 hours, obtaining 78.3 g of the target polymer, Polymer 8. The resin was analyzed for composition by $^1$H-NMR, finding that the copolymer consisted of Monomer 9, Monomer 10 and Monomer 10-Base 1 salt in a ratio of 89/9/2 mol %.

Base 1

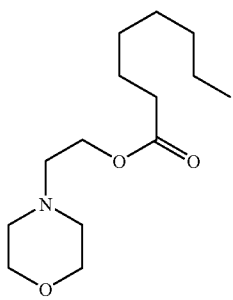

Polymer 8

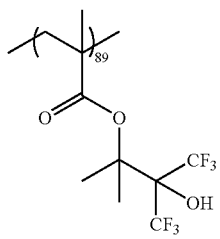 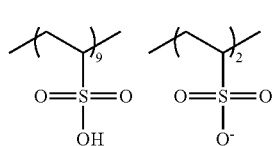

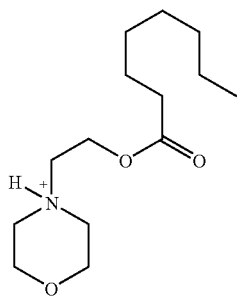

Polymer Synthesis Example 9
Copolymerization of Monomers 9 and 11 (90/10) in the Co-Presence of Base 1

Synthesis was carried out in accordance with the same formulation as in the synthesis of Polymer 8 aside from using Monomer 11 instead of Monomer 10, obtaining 75.3 g of the target polymer, Polymer 9. The resin was analyzed for composition by $^1$H-NMR, finding that the copolymer consisted of Monomer 9, Monomer 11 and Monomer 11-Base 1 salt in a ratio of 90/8/2 mol %.

Polymer 9

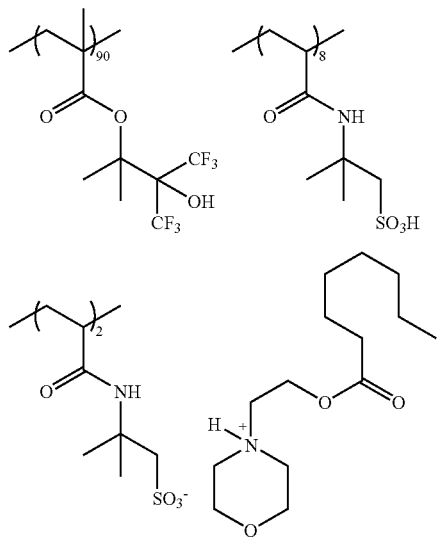

Polymer Synthesis Example 10
Copolymerization of Monomers 9 and 12 (90/10)

Synthesis was carried out in accordance with the same formulation as in the synthesis of Polymer 8 aside from mixing Base 1, obtaining 81.5 g of the target polymer, Polymer 10. The resin was analyzed for composition by $^1$H-NMR, finding that the copolymer consisted of Monomers 9 and 12 in a ratio of 90/10 mol %.

Polymer 10

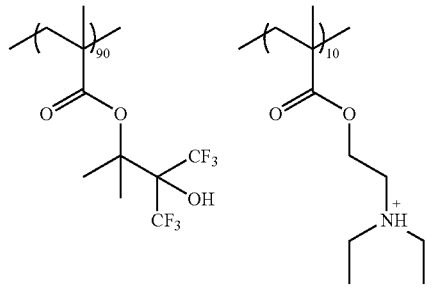

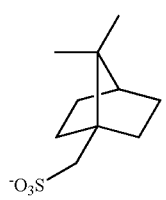

Polymer Synthesis Example 11
Copolymerization of Monomers 9 and 10 (90/10)

Synthesis was carried out in accordance with the same formulation as in the synthesis of Polymer 8 aside from mixing Base 1, obtaining 79.9 g of the target polymer, Polymer 11. The resin was analyzed for composition by $^1$H-NMR, finding that the copolymer consisted of Monomers 9 and 10 in a ratio of 89/11 mol %.

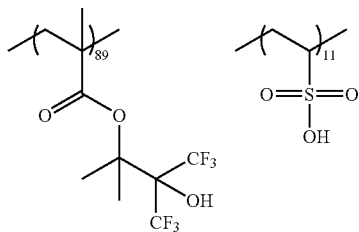

Polymer 11

Polymer Synthesis Example 12
Copolymerization of Monomers 13 and 10 (90/10)

Synthesis was carried out in accordance with the same formulation as in the synthesis of Polymer 8 aside from mixing Base 1, obtaining 77.8 g of the target polymer, Polymer 12. The resin was analyzed for composition by $^1$H-NMR, finding that the copolymer consisted of Monomers 13 and 10 in a ratio of 89/11 mol %.

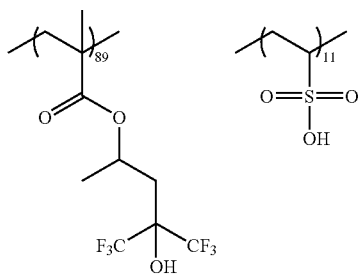

Polymer 12

Polymer Synthesis Example 13
Copolymerization of Monomers 13 and 11 (90/10)

Synthesis was carried out in accordance with the same formulation as in the synthesis of Polymer 8 aside from mixing Base 1, obtaining 78.9 g of the target polymer, Polymer 13. The resin was analyzed for composition by $^1$H-NMR, finding that the copolymer consisted of Monomers 13 and 11 in a ratio of 89/11 mol %.

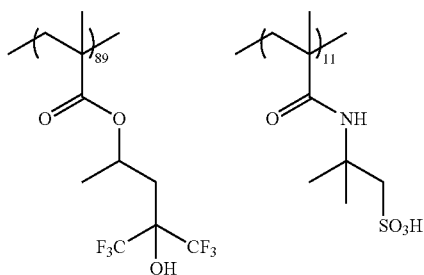

Polymer 13

Polymer Synthesis Example 14
Copolymerization of Monomers 9, 10 and 14 (90/7/3)

Synthesis was carried out in accordance with the same formulation as in the synthesis of Polymer 8 aside from mixing Base 1, obtaining 79.0 g of the target polymer, Polymer 14. The resin was analyzed for composition by $^1$H-NMR, finding that the copolymer consisted of Monomers 9, and 14 in a ratio of 89/7/4 mol %.

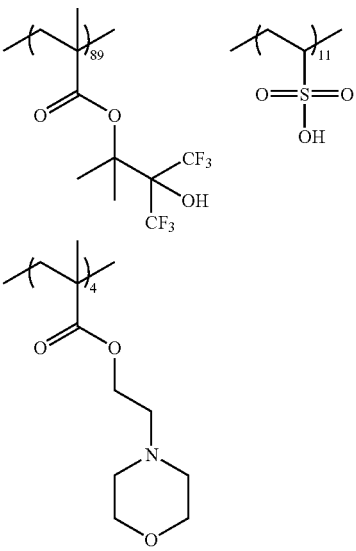

Polymer 14

Comparative Polymer Synthesis Example 1
Synthesis of Homopolymer of Monomer 9

To a flask in a nitrogen blanket, 100.0 g of Monomer 9, 3.91 g of dimethyl 2,2'-azobis(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for 3 hours while keeping the temperature at 80° C. After the maturing, the solution was cooled to room temperature. The polymerization solution thus obtained was added dropwise to 2,000 g of water, after which the precipitated polymer was filtered. The polymer was washed four times with 600 g of a 9/1 solvent mixture of hexane and isopropyl ether, whereupon white solids were isolated. The white solids were vacuum dried at 50° C. for 20 hours, obtaining 92.8 g of the target polymer, Comparative Polymer 1. The polymer was analyzed by GPC, finding Mw of 7,800 and Mw/Mn of 1.6.

Comparative Polymer Synthesis Example 2
Synthesis of Homopolymer of Monomer 13

A homopolymer of Monomer 13 was synthesized in accordance with the same formulation as in Comparative Polymer Synthesis Example 1. The polymer, Comparative Polymer 2, was analyzed by GPC, finding Mw of 7,900 and Mw/Mn of 1.6.

Evaluation of Protective Coating

Resist protective topcoat solutions TC-1 to 23 and Comparative-TC-1 to 4 were prepared by dissolving 1.0 g of each of Inventive Polymers 1 to 14 and Comparative Polymers 1 to 2 in a solvent mixture of 23 g of diisopentyl ether and 2 g of 2-methyl-1-butanol and filtering through a polypropylene filter with a pore size of 0.2 μm. In protective coating solutions TC-20 to 23, 1.5 parts by weight of a basic compound (shown in Table 2) per 100 parts by weight of Polymers was also added.

The resist protective topcoat solutions were spin coated onto silicon substrates and baked at 100° C. for 60 seconds to form protective films TC-1 to 23 and Comparative-TC-1 to 4 of 50 nm thick. The wafers coated with protective films were tested for the following properties: (1) a refractive index at wavelength 193 nm using a spectroscopic ellipsometer of J. A. Woollam Co., (2) a film thickness change after rinsing with deionized water for 5 minutes, (3) a film thickness change after development with 2.38 wt % tetramethylammonium hydroxide (TMAH) aqueous solution, and (4) a sliding angle and a receding contact angle using an inclination contact angle meter Drop Master 500 (Kyowa Interface Science Co., Ltd.). The results are shown in Table 2.

contact angle than the use of polymer PA alone, demonstrating insufficient layer separation between polymers PA and PB.

In general, a smaller sliding angle indicates an easier flow of water on the protective coating; and a larger receding contact angle indicates that fewer liquid droplets are left during high-speed scan exposure. It is seen from Table 2 that the topcoats TC-1 to 5 and TC-20 to 23 within the scope of the

TABLE 2

| Resist protective topcoat | Polymer in protective topcoat | Basic compound | Refractive index @193 nm | Film thickness change after water rinsing (nm) | Film thickness change after development (nm) | Sliding angle (°) | Receding contact angle (°) |
|---|---|---|---|---|---|---|---|
| TC-1 | Polymer 1 (100) | — | 1.54 | 0 | 0 | 10 | 81 |
| TC-2 | Polymer 2 (100) | — | 1.54 | 0 | 0 | 10 | 81 |
| TC-3 | Polymer 3 (100) | — | 1.53 | 0 | 0 | 11 | 78 |
| TC-4 | Polymer 4 (100) | — | 1.54 | 0 | 0 | 11 | 78 |
| TC-5 | Polymer 5 (100) | — | 1.53 | 0 | 0 | 10 | 82 |
| TC-6 | Polymer 6 (100) | — | 1.54 | 0 | 0 | 12 | 79 |
| TC-7 | Polymer 7 (100) | — | 1.54 | 0 | 0 | 10 | 82 |
| TC-8 | Polymer 1 (75) Polymer 8 (25) | — | 1.53 | 0 | 0 | 9 | 80 |
| TC-9 | Polymer 2 (75) Polymer 8 (25) | — | 1.54 | 0 | 0 | 10 | 80 |
| TC-10 | Polymer 3 (75) Polymer 8 (25) | — | 1.53 | 0 | 0 | 10 | 78 |
| TC-11 | Polymer 4 (75) Polymer 8 (25) | — | 1.54 | 0 | 0 | 11 | 78 |
| TC-12 | Polymer 5 (75) Polymer 8 (25) | — | 1.54 | 0 | 0 | 11 | 81 |
| TC-13 | Polymer 6 (75) Polymer 8 (25) | — | 1.53 | 0 | 0 | 12 | 79 |
| TC-14 | Polymer 1 (75) Polymer 9 (25) | — | 1.54 | 0 | 0 | 9 | 79 |
| TC-15 | Polymer 1 (75) Polymer 10 (25) | — | 1.53 | 0 | 0 | 9 | 80 |
| TC-16 | Polymer 1 (80) Polymer 11 (20) | — | 1.54 | 0 | 0 | 13 | 74 |
| TC-17 | Polymer 1 (80) Polymer 12 (20) | — | 1.54 | 0 | 0 | 14 | 73 |
| TC-18 | Polymer 1 (80) Polymer 13 (20) | — | 1.54 | 0 | 0 | 13 | 75 |
| TC-19 | Polymer 1 (80) Polymer 14 (20) | — | 1.54 | 0 | 0 | 13 | 74 |
| TC-20 | Polymer 1 (80) Polymer 11 (20) | N,N-dimethylalanine ethyl ester | 1.54 | 0 | 0 | 10 | 79 |
| TC-21 | Polymer 1 (80) Polymer 11 (20) | N,N-dimethylglycine methyl ester | 1.54 | 0 | 0 | 11 | 79 |
| TC-22 | Polymer 1 (80) Polymer 11 (20) | N,N-dimethylformamide diethyl acetal | 1.54 | 0 | 0 | 10 | 79 |
| TC-23 | Polymer 1 (80) Polymer 11 (20) | N,N-dimethyl-acetamide | 1.54 | 0 | 0 | 10 | 79 |
| Comparative TC-1 | Comparative Polymer 1 (100) | — | 1.53 | 0 | 0 | 15 | 69 |
| Comparative TC-2 | Comparative Polymer 2 (100) | — | 1.53 | 0 | 0 | 13 | 74 |
| Comparative TC-3 | Comparative Polymer 1 (75) Polymer 8 (25) | — | 1.53 | 0 | 0 | 15 | 68 |
| Comparative TC-4 | Comparative Polymer 2 (75) Polymer 8 (25) | — | 1.53 | 0 | 0 | 13 | 74 |

As seen from Table 2, the inventive polymers PA have a greater receding contact angle than the comparative polymers.

Topcoats TC-8 to 15 and TC-20 to 23 show that the value of receding contact angle differs little between a blend of polymers PA and PB and polymer PA alone, demonstrating effective layer separation between polymers PA and PB, that is, a layer of polymer PA is disposed on top of a layer of polymer PB. By contrast, TC-16 to 19 show smaller values of receding invention are improved in sliding angle and receding contact angle over Comparative TC-1 to 4.

Evaluation of Resist

A resist solution was prepared by dissolving 5 g of Resist Polymer, 0.5 g of a photoacid generator PAG1, and 0.1 g of Quencher 1 (all shown below) in 100 g of propylene glycol monoethyl ether acetate (PGMEA) and filtering through a polypropylene filter having a pore size of 0.2 μm.

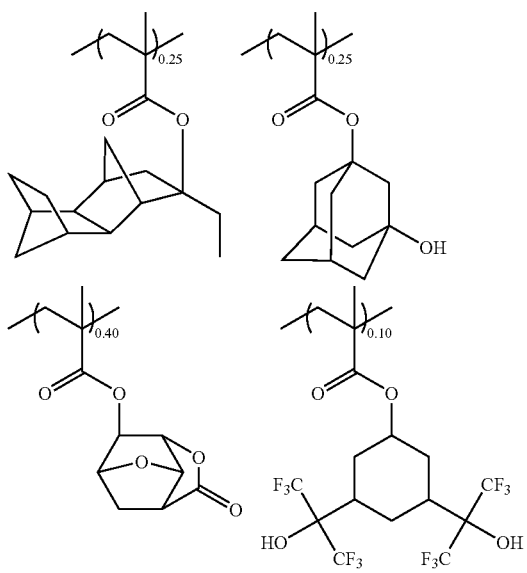

Resist Polymer
Mw = 7,600
Mw/Mn = 1.8

PAG 1

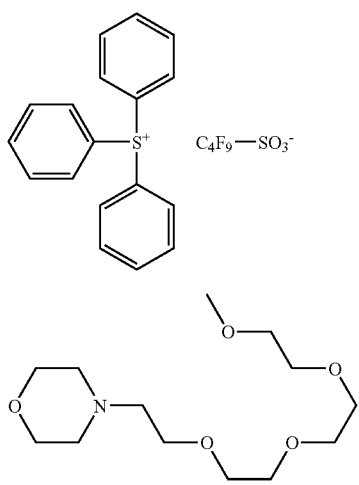

Quencher 1

An antireflective coating ARC-29A (Nissan Chemical Co., Ltd.) was deposited on a silicon substrate to a thickness of 87 nm. The resist solution was applied onto the ARC and baked at 105° C. for 60 seconds to form a resist film of 120 nm thick. The protective topcoat solution (prepared above) was applied onto the resist film and baked at 100° C. for 60 seconds. In order to simulate immersion lithography, light exposure was preceded by rinsing of the coating with deionized water for 5 minutes. The structure was exposed by means of an ArF scanner model S307E (Nikon Corp., NA 0.85, σ 0.93/0.62, 200 dipole illumination, 6% halftone phase shift mask), rinsed for 5 minutes while splashing deionized water, post-exposure baked (PEB) at 100° C. for 60 seconds, and developed with a 2.38 wt % TMAH aqueous solution for 60 seconds. As a comparative run, a similar process including light exposure, water rinsing, PEB and development was carried out in the absence of the protective coating. The wafers were sectioned for comparing the profile of 65-nm line-and-space pattern and sensitivity. Further, 0.5 μl of water droplet was dropped on the resist film after development, and a contact angle at the interface between the resist and water droplet was measured. The results are shown in Table 3.

TABLE 3

| Resist protective topcoat | Sensitivity (mJ/cm²) | 65-nm pattern profile | Contact angle with water after development (°) |
|---|---|---|---|
| TC-8 | 30 | rectangular | 60 |
| TC-9 | 29 | rectangular | 59 |
| TC-10 | 29 | rectangular | 60 |
| TC-11 | 30 | rectangular | 61 |
| TC-12 | 30 | rectangular | 61 |
| TC-13 | 29 | rectangular | 61 |
| TC-14 | 30 | rectangular | 60 |
| TC-15 | 30 | rectangular | 60 |
| TC-16 | 27 | rounded top, rectangular | 49 |
| TC-17 | 27 | rounded top, rectangular | 50 |
| TC-18 | 26 | rounded top, rectangular | 48 |
| TC-19 | 27 | rounded top, rectangular | 49 |
| TC-20 | 30 | rectangular | 60 |
| TC-21 | 29 | rectangular | 61 |
| TC-22 | 30 | rectangular | 60 |
| TC-23 | 30 | rectangular | 61 |
| Comparative TC-1 | 28 | rounded top | 68 |
| Comparative TC-2 | 29 | rounded top | 70 |
| no protective film | 30 | T-top | 62 |

When water rinsing was carried out after exposure in the absence of a protective topcoat, the resist pattern had a T-top profile. This is presumably because the acid generated was dissolved in water. In the presence of a protective topcoat according to the invention which had a large receding contact angle, the resist had a reduced contact angle after development and experienced little change of pattern profile after development.

The protective topcoat of polymer PA alone had a large receding contact angle, but a large contact angle with water after development. In contrast, a blend of polymer PA with polymer PB having a sulfonic acid amine salt formed a protective topcoat having a large receding contact angle and a small contact angle with water after development (see TC-8 to 15).

The protective topcoat of a blend of sulfo group-containing polymers (TC-16 to 19) had a reduced contact angle with water after development, but the resist pattern became slimmed. The addition of a basic compound to this blend resulted in a protective topcoat having a large receding contact angle and a small contact angle with water after development (see TC-20 to 23).

In a further run, some resist protective topcoat solutions (TC-8, TC-16, TC-21 and Comparative TC-2) used in the exposure experiment were precision filtered through a high-density polyethylene filter with a pore size of 0.02 μm. An antireflective coating ARC-29A (Nissan Chemical Co., Ltd.) of 87 nm thick was deposited on a 8-inch silicon substrate. The resist solution was applied onto the ARC and baked at 105° C. for 60 seconds to form a resist film of 120 nm thick. Each protective topcoat solution was coated thereon and baked at 100° C. for 60 seconds. Using an ArF scanner model S307E (Nikon Corp., NA 0.85, σ0.93, Cr mask), the entire surface of the wafer was subjected to checkered-flag exposure including alternate exposure of open-frame exposed and unexposed portions having an area of 20 mm square. This was followed by post-exposure baking (PEB) and development with a 2.38 wt % TMAH aqueous solution for 60 seconds.

Using a flaw detector Win-Win 50-1200 (Tokyo Seimitsu Co., Ltd.), the number of defects in the unexposed portion of the checkered-flag was counted at the pixel size of 0.125 μm. Those defects on the resist surface in the unexposed portion are stain-like defects and classified as blob defects. The results are shown in Table 4. It is evident that the protective topcoat compositions comprising a blend of polymers PA and PB produce a dramatically reduced number of defects, as compared with the comparative protective topcoat composition.

TABLE 4

| Resist protective topcoat | Number of defects |
|---|---|
| TC-8 | 15 |
| TC-16 | 2 |
| TC-21 | 0 |
| Comparative TC-2 | 3,000 |

EB Lithography

In an EB image writing test, a positive resist material was prepared by dissolving EB Polymer synthesized by radical polymerization, PAG2, and Quencher 2 (all shown below) in PGMEA and ethyl lactate (EL) in accordance with the formulation shown in Table 5 and filtering through a filter with a pore size of 0.2 µm.

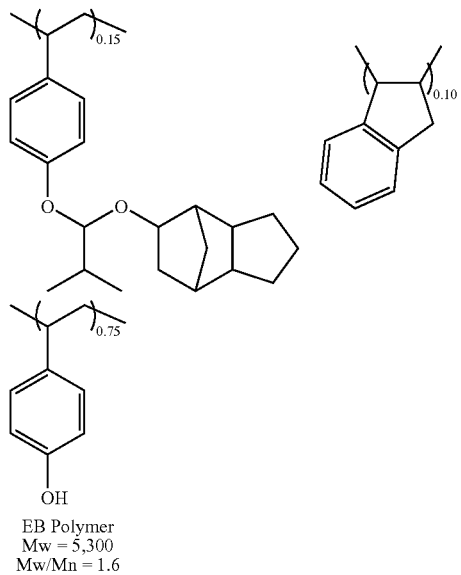

EB Polymer
Mw = 5,300
Mw/Mn = 1.6

PAG 2

Quencher 2

Using Clean Track Mark 5 (Tokyo Electron Ltd.), the positive resist material was spin coated on a silicon substrate with a diameter of 6 inches (150 mm) and prebaked on a hot plate at 110° C. for 60 seconds to form a resist film of 200 nm thick. A protective coating was coated thereon. Using HL-800D (Hitachi, Ltd.) at a HV voltage of 50 keV, imagewise exposure was performed on the wafer in a vacuum chamber. The wafer was then allowed to stand in the vacuum chamber for 20 hours, after which additional imagewise exposure was performed at a different area.

Using Clean Track Mark 5 (Tokyo Electron Ltd.), immediately after the imagewise exposure, the wafer was post-exposure baked (PEB) on a hot plate at 90° C. for 60 seconds and puddle developed in a 2.38 wt % TMAH aqueous solution for 30 seconds to form a positive pattern.

Using a measurement SEM S-7280 (Hitachi, Ltd.), a size change during the vacuum holding duration was determined. After an exposure dose which provided a 1:1 resolution at the top and bottom of a 0.12 µm line-and-space pattern was determined, a 0.12 µm line-and-space pattern at that exposure dose was measured for line width in both the initially exposed area and the 20 hour later exposed area. A difference therebetween is the size change. Positive values of size change indicate that the resist sensitivity varies toward a higher level during vacuum holding whereas negative values indicate that the sensitivity varies toward a lower level. The results are shown in Table 5.

TABLE 5

| Resist polymer (pbw) | PAG (pbw) | Basic compound (pbw) | Organic solvent (pbw) | Protective topcoat | Size change (nm) |
|---|---|---|---|---|---|
| EB Polymer (100) | PAG2 (10) | Quencher2 (0.4) | PGMEA (700) EL (300) | TC-8 | 0 |
| EB Polymer (100) | PAG2 (10) | Quencher2 (0.4) | PGMEA (700) EL (300) | TC-9 | −1 |
| EB Polymer (100) | PAG2 (10) | Quencher2 (0.4) | PGMEA (700) EL (300) | TC-10 | 0 |
| EB Polymer (100) | PAG2 (10) | Quencher2 (0.4) | PGMEA (700) EL (300) | TC-11 | −1 |
| EB Polymer (100) | PAG2 (10) | Quencher2 (0.4) | PGMEA (700) EL (300) | TC-12 | −1 |
| EB Polymer (100) | PAG2 (10) | Quencher2 (0.4) | PGMEA (700) EL (300) | TC-13 | 0 |
| EB Polymer (100) | PAG2 (10) | Quencher2 (0.4) | PGMEA (700) EL(300) | TC-14 | 0 |
| EB Polymer (100) | PAG2 (10) | Quencher2 (0.4) | PGMEA (700) EL (300) | TC-15 | 0 |
| EB Polymer (100) | PAG2 (10) | Quencher2 (0.4) | PGMEA (700) EL (300) | — | −9 |

In the EB imagewise exposure test, the application of inventive resist protective topcoats (TC-8 to 15) improved the stability of resist during post-exposure vacuum holding.

While the invention has been described with reference to preferred embodiments, they are merely exemplary. It is intended that the invention not be limited to the particular embodiment disclosed as the best mode contemplated for carrying out this invention, but that the invention will include all embodiments falling within the scope of the appended claims.

Japanese Patent Application No. 2008-124503 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist protective coating composition comprising a polymer P1 comprising repeat units of the general formulae (1a) and (2a):

P1

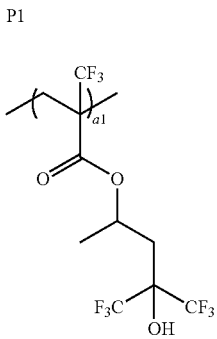
(1a)

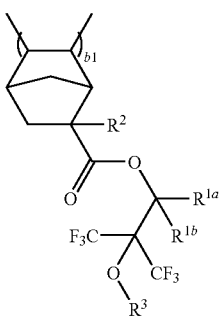
(2a)

wherein $R^{1a}$ and $R^{1b}$ are hydrogen or straight, branched or cyclic $C_1$-$C_{10}$ alkyl, $R^{1a}$ and $R^{1b}$ may bond together to form a non-aromatic ring with the carbon atom to which they are attached, $R^2$ is hydrogen, methyl or trifluoromethyl, $R^3$ is hydrogen or an acid labile group, and a1 and b1 are numbers satisfying 0<a1<1, 0<b1<1, and 0<a1+b1≦1.

2. A resist protective coating composition comprising a polymer P1' comprising repeat units of the general formulae (1a), (1b) and (2a):

P1'

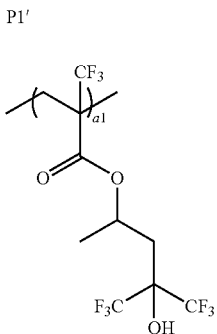
(1a)

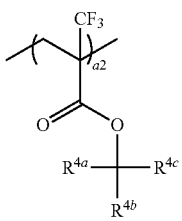
(1b)

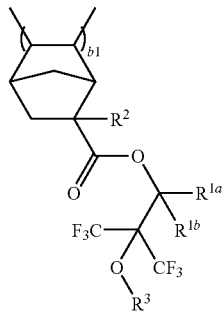
(2a)

wherein $R^{1a}$ and $R^{1b}$ are hydrogen or straight, branched or cyclic $C_1$-$C_{10}$ alkyl, $R^{1a}$ and $R^{1b}$ may bond together to form a non-aromatic ring with the carbon atom to which they are attached, $R^2$ is hydrogen, methyl or trifluoromethyl, $R^3$ is hydrogen or an acid labile group, $R^{4a}$ to $R^{4c}$ are hydrogen or straight, branched or cyclic $C_1$-$C_{10}$ alkyl, and a1, a2 and b1 are numbers satisfying 0<a1<1, 0<a2<1, 0<b1<1, and 0<a1+a2+b1≦.1.

3. A resist protective coating composition comprising a polymer P1" comprising repeat units of the general formulae (1a), (1b), (2a) and (2b):

P1"

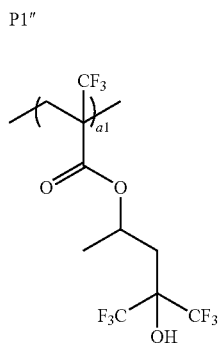
(1a)

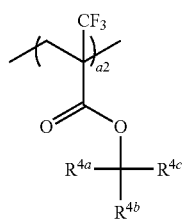
(1b)

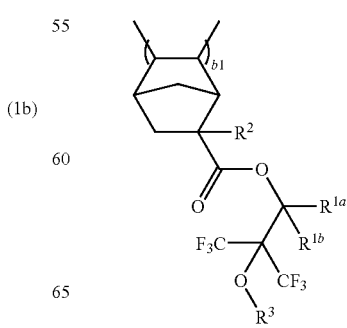
(2a)

-continued

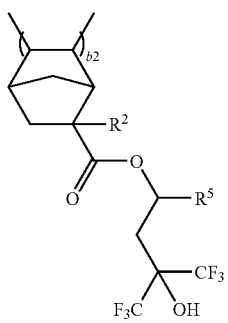

(2b)

wherein $R^{1a}$ and $R^{1b}$ are hydrogen or straight, branched or cyclic $C_1$-$C_{10}$ alkyl, $R^{1a}$ and $R^{1b}$ may bond together to form a non-aromatic ring with the carbon atom to which they are attached, $R^2$ is hydrogen, methyl or trifluoromethyl, $R^3$ is hydrogen or an acid labile group, $R^{4a}$ to $R^{4c}$ are hydrogen or straight, branched or cyclic $C_1$-$C_{10}$ alkyl, $R^5$ is straight, branched or cyclic $C_1$-$C_{10}$ alkyl, and a1, a2, b1 and b2 are numbers satisfying $0<a1<1$, $0\leq a2<1$, $0\leq b1<1$, $0<b2<1$, and $0<a1+a2+b1+b2\leq 1$.

4. A resist protective coating composition comprising a polymer P2 corresponding to a polymer P1-H comprising repeat units of the general formulae (1a) and (2a') wherein some or all of hydroxyl groups in either one or both of formula (1a) and formula (2a') are protected with protective groups,

P1-H

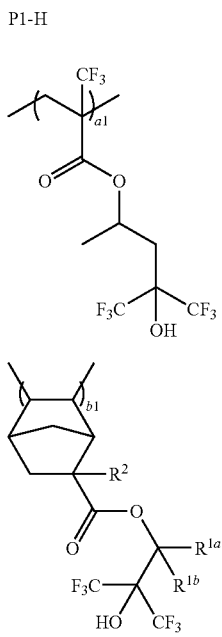

(1a)

(2a')

wherein $R^{1a}$ and $R^{1b}$ are hydrogen or straight, branched or cyclic $C_1$-$C_{10}$ alkyl, $R^{1a}$ and $R^{1b}$ may bond together to form a non-aromatic ring with the carbon atom to which they are attached, $R^2$ is hydrogen, methyl or trifluoromethyl, and a1 and b1 are numbers satisfying $0<a1<1$, $0<b1<1$, and $0<a1+b1\leq .1$.

5. The protective coating composition of claim 1, further comprising a solvent.

6. The protective coating composition of claim 5 wherein the solvent comprises an ether compound of 8 to 12 carbon atoms.

7. The protective coating composition of claim 6 wherein the solvent comprises at least one ether compound of 8 to 12 carbon atoms selected from the group consisting of di-n-butyl ether, diisobutyl ether, di-sec-butyl ether, di-n-pentyl ether, diisopentyl ether, di-sec-pentyl ether, di-t-amyl ether, di-n-hexyl ether, methyl cyclopentyl ether, and methyl cyclohexyl ether.

8. The protective coating composition of claim 6 wherein the solvent comprises a mixture of the ether compound and 0.1 to 90% by weight of a higher alcohol of 4 to 10 carbon atoms.

9. The protective coating composition of claim 8 wherein the higher alcohol is at least one compound selected from the group consisting of 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol.

10. A resist protective coating composition comprising:
a polymer P1 comprising repeat units of the general formulae (1a) and (2a):

P1

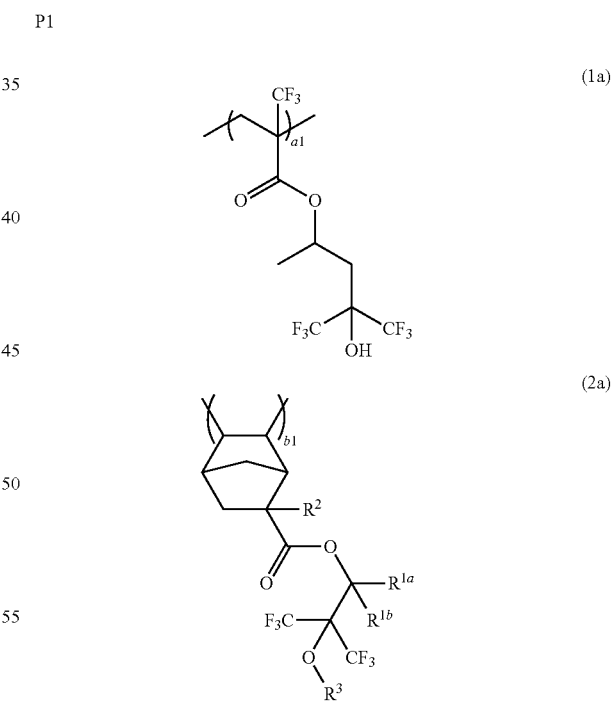

(1a)

(2a)

wherein $R^{1a}$ and $R^{1b}$ are hydrogen or straight, branched or cyclic $C_1$-$C_{10}$ alkyl, $R^{1a}$ and $R^{1b}$ may bond together to form a non-aromatic ring with the carbon atom to which they are attached, $R^2$ is hydrogen, methyl or trifluoromethyl, $R^3$ is hydrogen or an acid labile group, and a1 and b1 are numbers satisfying $0<a1<1$, $0<b1<1$, and $0<a1+b1\leq 1$; and a polymer P3 comprising repeat units of the general formulae (3a), (3b), (4a) and (4b):

P3

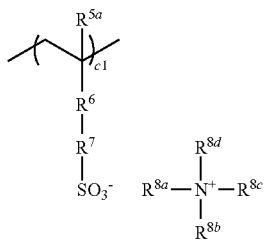
(3a)

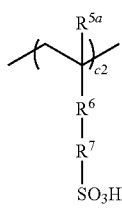
(3b)

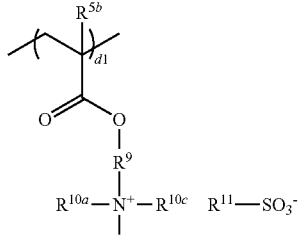
(4a)

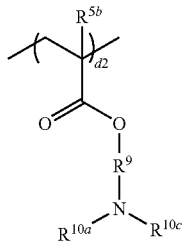
(4b)

wherein $R^{5a}$ and $R^{5b}$ are hydrogen or methyl,
$R^6$ is a single bond, $C_1$-$C_4$ alkylene, —C(=O)—O— or —C(=O)—NH—,
$R^7$ is a single bond or straight, branched or cyclic $C_1$-$C_8$ alkylene,
$R^{8a}$ to $R^{8d}$ and $R^{10a}$ to $R^{10c}$ are each independently selected from the group consisting of hydrogen, straight, branched or cyclic $C_1$-$C_{12}$ alkyl, alkenyl, oxoalkyl and oxoalkenyl, $C_6$-$C_{20}$ aryl, $C_7$-$C_{12}$ aralkyl and aryloxoalkyl, in which some or all hydrogen atoms may be substituted by alkoxy groups, $R^{8a}$ to $R^{8d}$ and $R^{10a}$ to $R^{10c}$ may contain a nitrogen atom, ether, ester, hydroxyl or carboxyl group, at least two of $R^{8a}$ to $R^{8d}$ and at least two of $R^{10a}$ to $R^{10c}$ may bond together to form a ring with the nitrogen atom to which they are attached, in this event, each participant in the ring formation independently denotes a $C_3$-$C_{10}$ alkylene or a group forming with the nitrogen atom a hetero-aromatic ring containing said nitrogen atom therein,
$R^9$ is straight, branched or cyclic $C_1$-$C_8$ alkylene,
$R^{11}$ is a straight, branched or cyclic $C_1$-$C_{20}$ alkyl which may have a carbonyl, ester, ether group or halogen atom, or a $C_6$-$C_{10}$ aryl which may have a carbonyl, ester, ether, halogen atom, $C_1$-$C_{10}$ alkyl or fluoroalkyl,
c1, c2, d1, and d2 are numbers satisfying $0 \leq c1 < 1$, $0 \leq c2 < 1$, $0 \leq d1 < 1$, $0 \leq d2 < 1$, and $0 < c1+c2+d1+d2 < 1$, and if $0 < d2$, then $0 < c2$.

11. A pattern forming process comprising the steps of (1) applying a resist material onto a substrate to form a photoresist film, (2) applying the resist protective coating composition of claim 10 onto the photoresist film to form a protective coating thereon, (3) heat treating and exposing the coated substrate to high-energy radiation from a projection lens through a photomask while holding a liquid between the substrate and the projection lens, and (4) developing with a developer.

12. The process of claim 11 wherein the liquid is water.

13. The process of claim 11 wherein the high-energy radiation has a wavelength in the range of 180 to 250 nm.

14. The process of claim 11 wherein the developing step uses a liquid alkaline developer for thereby developing the photoresist film to form a resist pattern and stripping the resist protective coating therefrom at the same time.

15. A lithography process for forming a pattern, comprising the steps of forming a protective coating on a photoresist layer disposed on a mask blank, exposing the layer structure in vacuum to electron beam, and developing, the protective coating being formed of the protective coating composition of claim 10.

16. A resist protective coating composition comprising:
a polymer P1 comprising repeat units of the general formulae (1a) and (2a):

P1

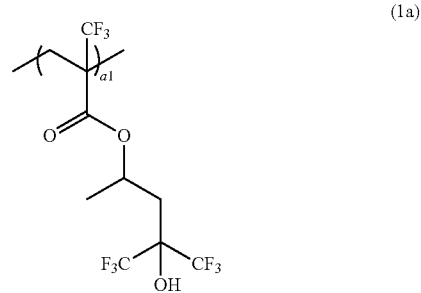
(1a)

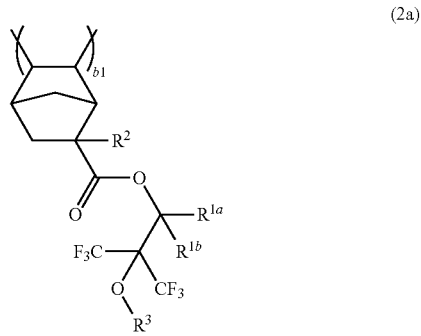
(2a)

wherein $R^{1a}$ and $R^{1b}$ are hydrogen or straight, branched or cyclic $C_1$-$C_{10}$ alkyl, $R^{1a}$ and $R^{1b}$ may bond together to form a non-aromatic ring with the carbon atom to which they are attached, $R^2$ is hydrogen, methyl or trifluoromethyl, $R^3$ is hydrogen or an acid labile group, and a1 and b1 are numbers satisfying $0 < a1 < 1$, $0 < b1 < 1$, and $0 < a1+b1 \leq 1$, and a polymer P3' comprising repeat units of the general formulae (3a), (3b), (4a), (4b) and (5):

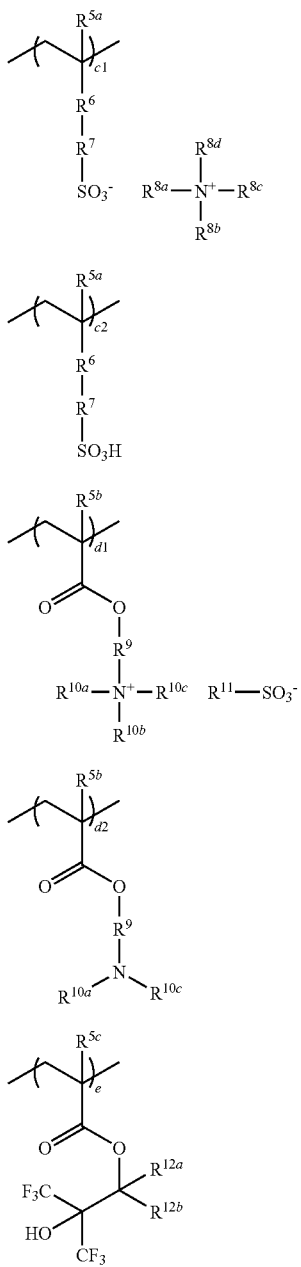

wherein $R^{5a}$ to $R^{5c}$ are hydrogen or methyl,
$R^6$ is a single bond, $C_1$-$C_4$ alkylene, —C(=O)—O— or —C(=O)—NH—,
$R^7$ is a single bond or straight, branched or cyclic $C_1$-$C_8$ alkylene,
$R^{8a}$ to $R^{8d}$ and $R^{10a}$ to $R^{10c}$ are each independently selected from the group consisting of hydrogen, straight, branched or cyclic $C_1$-$C_{12}$ alkyl, alkenyl, oxoalkyl and oxoalkeny, $C_6$-$C_{20}$ aryl, $C_7$-$C_{12}$ aralkyl and aryloxoalkyl, in which some or all hydrogen atoms may be substituted by alkoxy groups, $R^{8a}$ to $R^{8d}$ and $R^{10a}$ to $R_{10c}$ may contain a nitrogen atom, ether, ester, hydroxyl or carboxyl group, at least two of $R^{8a}$ to $R^{8d}$ and at least two of $R^{10a}$ to $R^{10c}$ may bond together to form a ring with the nitrogen atom to which they are attached, in this event, each participant in the ring formation independently denotes a $C_3$-$C_{10}$ alkylene or a group forming with the nitrogen atom a hetero-aromatic ring containing said nitrogen atom therein,
$R^9$ is straight, branched or cyclic $C_1$-$C_8$ alkylene,
$R^{11}$ is a straight, branched or cyclic $C_1$-$C_{20}$ alkyl which may have a carbonyl, ester, ether group or halogen atom, or a $C_6$-$C_{10}$ aryl which may have a carbonyl, ester, ether, halogen atom, $C_1$-$c_{10}$alkyl or fluoroalkyl,
$R^{12a}$ and $R^{12b}$ are hydrogen or straight, branched or cyclic $C_1$-$C_{10}$ alkyl, $R^{12a}$ and $R^{12b}$ may bond together to form a ring with the carbon atom to which they are attached,
c1, c2, d1, d2, and e are numbers satisfying $0 \leq c1 < 1$, $0 \leq c2 < 1$, $0 \leq d1 < 1$, $0 \leq d2 < 1$, $0 < e < 1$, $0 < c1+c2+d1+d2 < 1$, and $0.3 \leq c1+c2+d1+d2+e \leq .1$, and if $0 < d2$, then $0 < c2$.

17. A pattern forming process comprising the steps of (1) applying a resist material onto a substrate to form a photoresist film, (2) applying the resist protective coating composition of claim 16 onto the photoresist film to form a protective coating thereon, (3) heat treating and exposing the coated substrate to high-energy radiation from a projection lens through a photomask while holding a liquid between the substrate and the projection lens, and (4) developing with a developer.

18. The process of claim 17 wherein the liquid is water.

19. The process of claim 17 wherein the high-energy radiation has a wavelength in the range of 180 to 250 nm.

20. The process of claim 17 wherein the developing step uses a liquid alkaline developer for thereby developing the photoresist film to form a resist pattern and stripping the resist protective coating therefrom at the same time.

21. A lithography process for forming a pattern, comprising the steps of forming a protective coating on a photoresist layer disposed on a mask blank, exposing the layer structure in vacuum to electron beam, and developing, the protective coating being formed of the protective coating composition of claim 16.

* * * * *